United States Patent
Rinzler et al.

(10) Patent No.: US 9,214,644 B2
(45) Date of Patent: Dec. 15, 2015

(54) ACTIVE MATRIX DILUTE SOURCE ENABLED VERTICAL ORGANIC LIGHT EMITTING TRANSISTOR

(75) Inventors: Andrew Gabriel Rinzler, Gainesville, FL (US); Mitchell Austin McCarthy, Gainesville, FL (US); Bo Liu, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/519,176

(22) PCT Filed: Dec. 7, 2011

(86) PCT No.: PCT/US2011/063745
§ 371 (c)(1),
(2), (4) Date: Jun. 26, 2012

(87) PCT Pub. No.: WO2012/078759
PCT Pub. Date: Jun. 14, 2012

(65) Prior Publication Data
US 2013/0240842 A1 Sep. 19, 2013

Related U.S. Application Data

(60) Provisional application No. 61/420,512, filed on Dec. 7, 2010.

(51) Int. Cl.
*H01L 51/52* (2006.01)
*H01L 29/16* (2006.01)
(Continued)

(52) U.S. Cl.
CPC ........ *H01L 51/5203* (2013.01); *H01L 27/3274* (2013.01); *H01L 29/1606* (2013.01);
(Continued)

(58) Field of Classification Search
CPC .......................... H01L 51/5296; H01L 51/057
USPC ........................................................ 257/329
See application file for complete search history.

(56) References Cited

U.S. PATENT DOCUMENTS

2005/0245087 A1* 11/2005 Sasagawa et al. ............. 438/706
2006/0244391 A1* 11/2006 Shishido et al. ........... 315/169.3
(Continued)

FOREIGN PATENT DOCUMENTS

CN         1324550 A      11/2001
JP       2003-108034 A     4/2003
(Continued)

OTHER PUBLICATIONS

PCT International Search Report and Written Opinion in co-pending, related PCT application No. PCT/US2011/063745, mailed Dec. 7, 2011.
(Continued)

*Primary Examiner* — Peniel M Gumedzoe
*Assistant Examiner* — Christopher Johnson
(74) *Attorney, Agent, or Firm* — Wolf, Greenfield & Sacks, P.C.

(57) ABSTRACT

Various embodiments are provided for dilute source enabled vertical organic light emitting transistors. In various embodiments, a display panel includes an array of pixels. In one embodiment, among others, at least one pixel includes a switching transistor and a driving transistor coupled to the switching transistor, where the driving transistor is configured to emit light responsive to activation by the switching transistor. The driving transistor may be a dilute source enabled vertical organic light emitting transistor (DS-VOLET). The switching transistor may include a dilute source enabled vertical-field effect transistor (DS-VFET). In another embodiment, a double dilute source enabled vertical-field effect transistor (DS-VFET) includes a first DS-VFET coupled to a second DS-VFET.

70 Claims, 28 Drawing Sheets

(51) Int. Cl.
  H01L 29/78    (2006.01)
  H01L 51/05    (2006.01)
  H01L 51/10    (2006.01)
  H01L 27/32        (2006.01)
  B82Y 99/00        (2011.01)
  H01L 51/00        (2006.01)

(52) U.S. Cl.
  CPC .......... *H01L29/7827* (2013.01); *H01L 51/057* (2013.01); *H01L 51/102* (2013.01); *H01L 51/5296* (2013.01); *B82Y 99/00* (2013.01); *H01L 27/3262* (2013.01); *H01L 51/0045* (2013.01); *H01L 51/0048* (2013.01)

(56) References Cited

U.S. PATENT DOCUMENTS

| | | |
|---|---|---|
| 2008/0272381 A1 | 11/2008 | Noguchi et al. |
| 2009/0230384 A1 | 9/2009 | Meng et al. |
| 2010/0237336 A1* | 9/2010 | Rinzler et al. ............... 257/40 |
| 2010/0309233 A1* | 12/2010 | Choi ........................... 345/690 |
| 2011/0121271 A1* | 5/2011 | Jeon et al. ................... 257/40 |
| 2012/0143568 A1* | 6/2012 | Kagan et al. ................ 702/189 |

FOREIGN PATENT DOCUMENTS

| | | |
|---|---|---|
| JP | 2003-330412 A | 11/2003 |
| JP | 2005-128310 A | 5/2005 |
| JP | 2006-171745 A | 6/2006 |
| JP | 2006-301629 A | 11/2006 |
| JP | 2007-200788 A | 8/2007 |
| KR | 10-2005-0098333 | 7/2006 |

OTHER PUBLICATIONS

International Preliminary Report on Patentability dated Jun. 20, 2013.

* cited by examiner

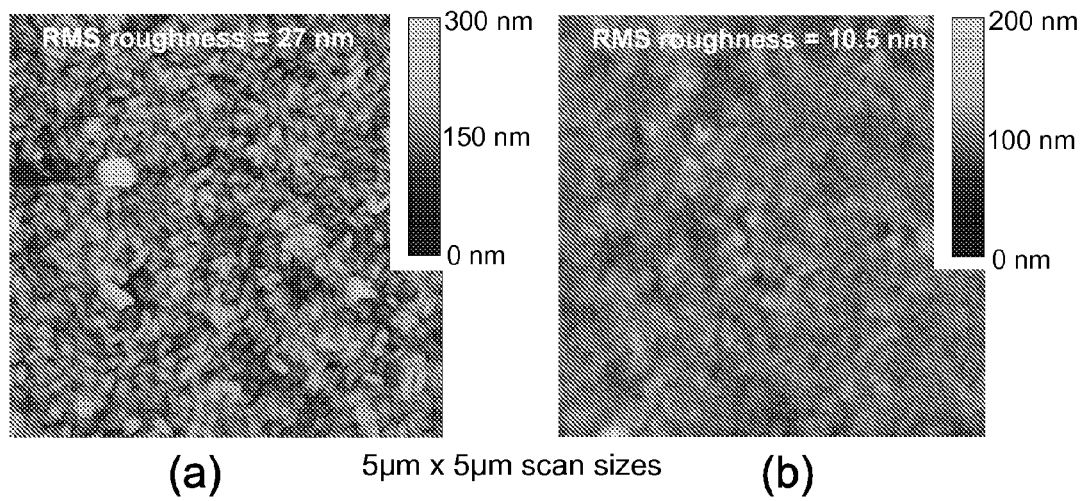
FIG. 5
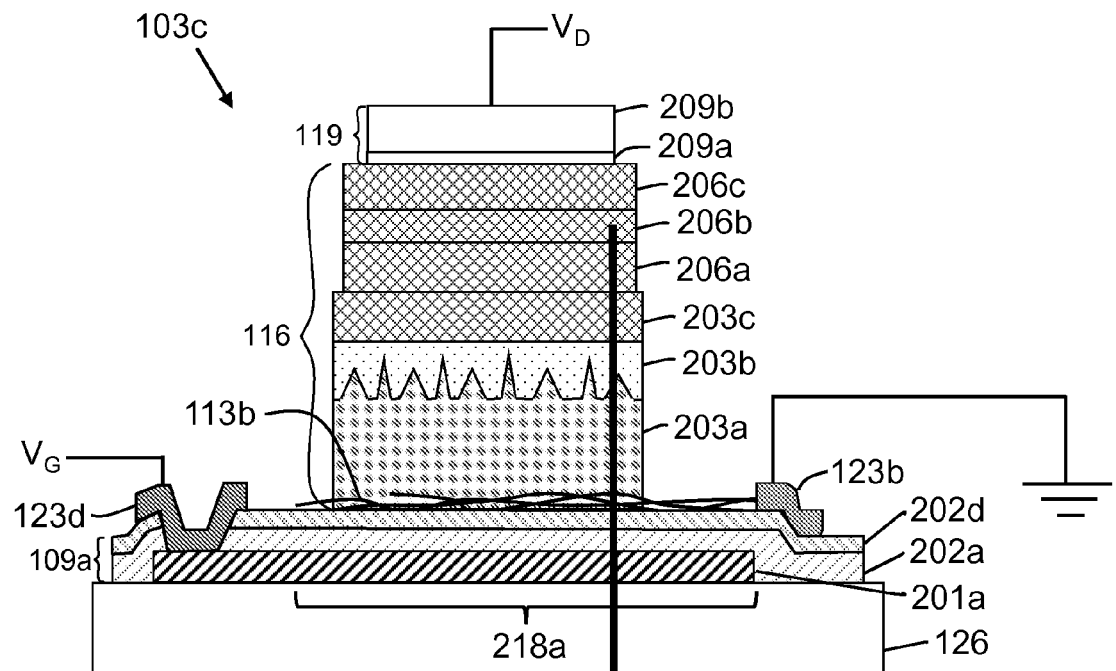
FIG. 6
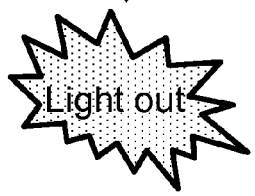

ACTIVE MATRIX DILUTE SOURCE ENABLED VERTICAL ORGANIC LIGHT EMITTING TRANSISTOR

CROSS-REFERENCE TO RELATED APPLICATION

This application is the 35 U.S.C. §371 national stage of PCT application PCT/US2011/063745, filed Dec. 7, 2011, which claims priority to and the benefit of U.S. Provisional Application No. 61/420,512, filing date Dec. 7, 2010, which is hereby incorporated by reference in its entirety.

STATEMENT AS TO FEDERALLY SPONSORED RESEARCH

The invention was made with government support under agreement ECCS-0824157/00069937 awarded by the National Science Foundation. The government has certain rights in the invention.

BACKGROUND

Display technologies continue to evolve in response to different market demands. Improved contrast ratio, insensitivity to viewing angle, power savings, and reduction in manufacturing cost drive many of the development efforts. However, conversions of existing display technologies that reduce power consumption are often at odds with improvements in the display contrast and intensity.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 5 includes images illustrating planarization by poly [9,9-dioctyl-fluorene-co-N-(4-butylphenyl)-diphenylamine] (TFB) of a rough polycrystalline surface in accordance with various embodiments of the present disclosure.

FIG. 6 is a cross-sectional view of an example of an active cell of the AMDS-VOLET of FIG. 1A including TFB planarization layer of FIG. 5 in accordance with various embodiments of the present disclosure.

DESCRIPTION

Figure 1A:
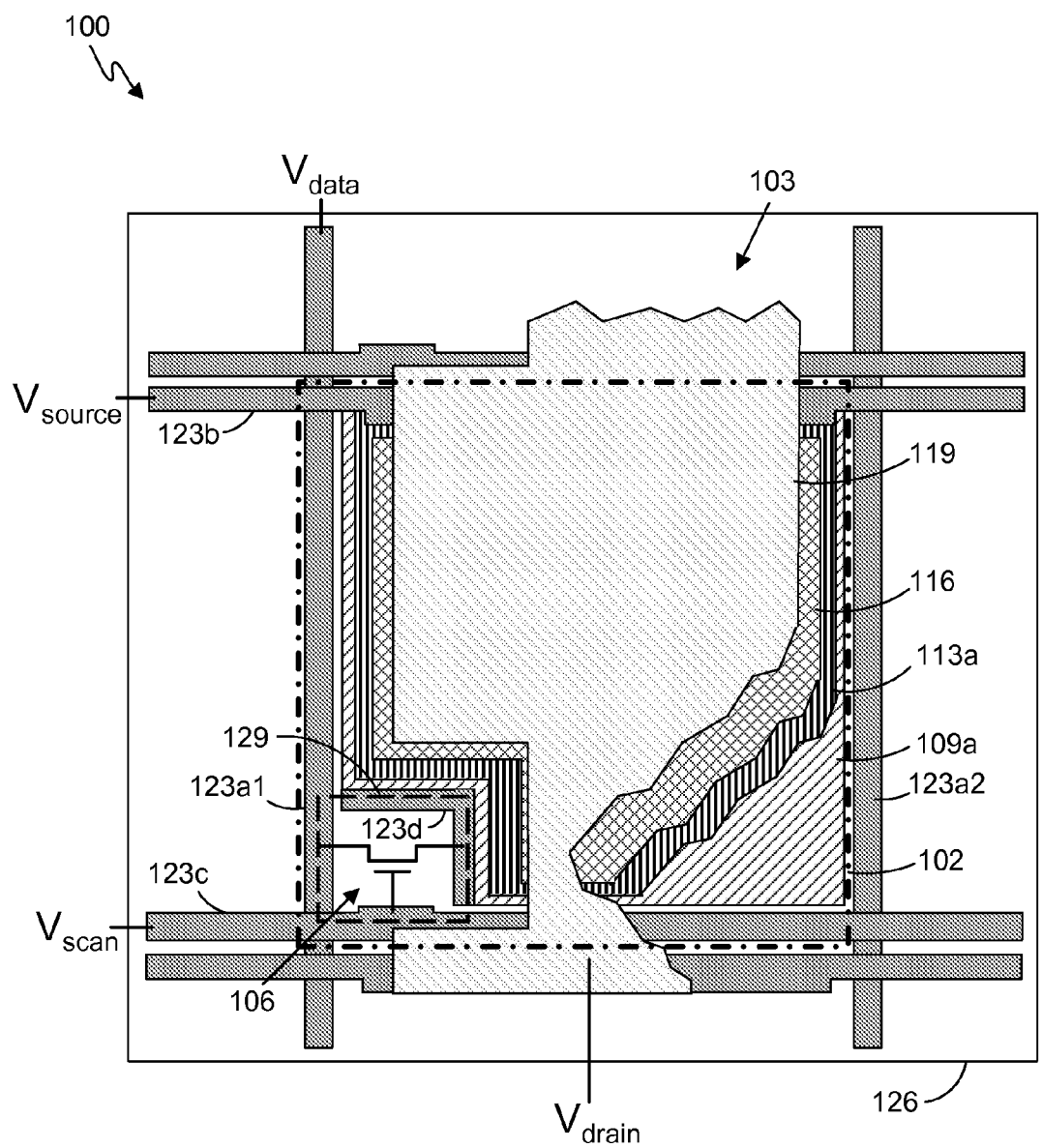
FIG. 1A is a plan view of an example of an active matrix dilute source-enabled vertical organic light emitting transistor (AMDS-VOLET) pixel in accordance with various embodiments of the present disclosure.

Disclosed herein are various embodiments related to active matrix dilute source enabled vertical organic light emitting transistors (AMDS-VOLETs). Reference will now be made in detail to the description of the embodiments as illustrated in the drawings, wherein like reference numbers indicate like parts throughout the several views.

For reasons of power savings, improved contrast ratio, and insensitivity to viewing angle, a technological conversion is taking place from existing display technologies to active matrix organic light emitting diode (AMOLED) displays. A roadblock to this conversion is supplying the high drive currents needed by the organic light emitting diodes (OLEDs) from thin film transistors (TFTs) in the backplane. Using polycrystalline silicon (poly-Si) as the channel material is an option to achieve the high drive currents, but poly-Si adds high manufacturing costs and has non-uniformity issues. Organic semiconductor materials for the TFT channel material may be less expensive, but organic semiconductor materials cannot compete with the output currents of poly-Si.

One way to achieve high output current using an organic semiconductor material is to make the channel length of the TFT short. In a conventional lateral channel TFT design, shortening the channel length involves placing the source and drain terminals of the TFT very close to each other. However, this can be expensive due to the need for high resolution patterning. A dilute source enabled, vertical-field effect transistor (DS-VFET) circumvents this issue. The channel length of a DS-VFET is defined by the thickness of the semiconductor thin film channel layer, leading to sub-micron channels lengths without using high resolution patterning. This allows the high drive currents useful for operating OLEDs at a power consumption comparable to poly-Si TFTs. A DS-VFET may also be converted to a device that itself emits light, thereby reducing the number of components needed in the pixel backplane. A DS-VFET light emitting combination device is termed the dilute source enabled vertical organic light emitting transistor (DS-VOLET).

The present application describes various embodiments of a display panel, pixel, and active cell including a DS-VOLET. In a conventional AMOLED pixel, a driving transistor and charge storage capacitor reside next to the OLED device occupying pixel area and thus reduces the aperture ratio (the ratio of the OLED light emitting area to the total pixel area). In the various embodiments described, the DS-VOLET includes the driving transistor and storage capacitor as part of its structure, allowing the DS-VOLET to be larger and, thus, increase the light emitting area. This also simplifies the manufacturing process as fewer discrete circuit components are needed. Further, in each pixel, the DS-VOLET is coupled to a switching transistor (Sw-T), and various embodiments of the Sw-T will be described below as well.

Figure 1B:
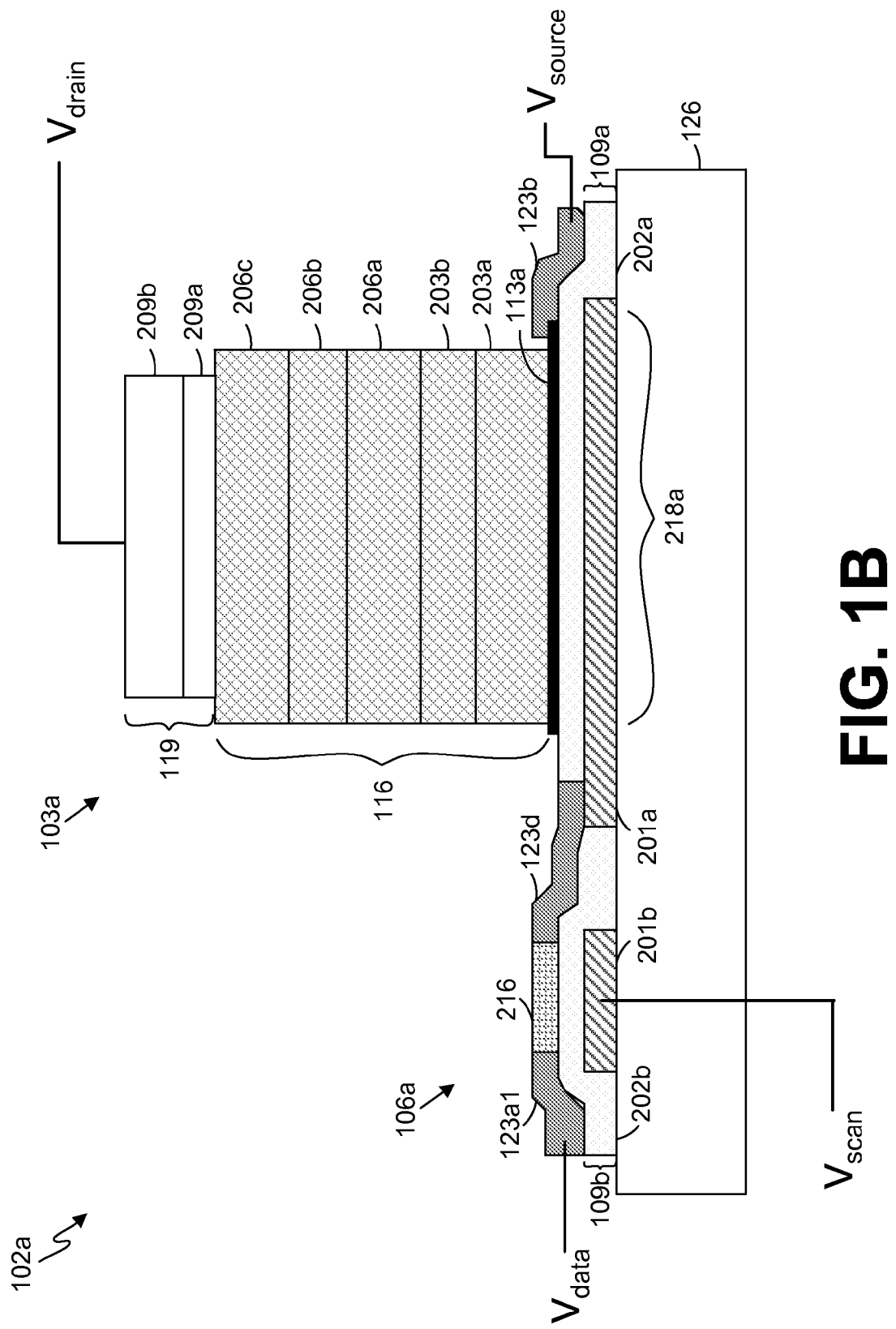
FIGS. 1B and 1C are cross-sectional views of examples of active cells of the AMDS-VOLET pixel of FIG. 1A in accordance with various embodiments of the present disclosure.

FIG. 1A is a plan view of an example layout of an embodiment of an active matrix dilute source-enabled vertical organic light emitting transistor (AMDS-VOLET) pixel 100. The AMDS-VOLET pixel 100 includes an embodiment of an active cell 102, which lies in the area surrounded by conducting lines 123, as shown in FIG. 1A. FIG. 1B provides a cross-sectional view of an embodiment of the active cell 102 illustrated in FIG. 1A, denoted herein as 102a. The active cell 102 illustrated in FIGS. 1A and 1B includes an example layout of an embodiment of a DS-VOLET 103. A switching transistor (Sw-T) 106 (represented by a transistor circuit element) is coupled to the DS-VOLET 103 and the conducting lines 123, denoted herein as 123a1, 123a2, 123b, 123c, and 123d. The layouts of various embodiments of the Sw-T 106 will be discussed in detail below.

The conducting lines 123 included in the embodiment of an AMDS-VOLET pixel 100 illustrated in FIGS. 1A and 1B includes two data conducting lines 123a, denoted herein as 123a1 and 123a2, that each provide a respective $V_{data}$ voltage signal. The conducting lines 123 further include a source conducting line 123b (i.e., providing a $V_{source}$ voltage signal) and a scan conducting line 123c (i.e., providing a $V_{scan}$ voltage signal). Additionally, a conducting line 123d couples the Sw-T 106 to the DS-VOLET 103.

The DS-VOLET 103 is the light emitting component of the AMDS-VOLET pixel 100. Instead of including a separate driving transistor and charge storage capacitor in the AMDS-VOLET pixel 100, the DS-VOLET 103 incorporates the driving transistor and storage capacitor within the stack of the DS-VOLET 103. By including the driving transistor and storage capacitor within the stack of the DS-VOLET 103, a driving transistor and storage capacitor that are separate from the DS-VOLET 103 are unnecessary. Moreover, because the driving transistor and storage capacitor are included within the DS-VOLET 103, the light emitting portion of the AMDS-VOLET pixel 100 is larger than the light emitting portion of a conventional pixel. The increase in the light emitting portion increases the aperture ratio of the AMDS-VOLET pixel 100. This increase in the light emitting portion enables the AMDS-VOLET pixel 100 to output the same light intensity as conventional pixels, but the AMDS-VOLET pixel 100 uses a lower current density, which may increase the lifetime of the AMDS-VOLET pixel 100. Also, in some embodiments, the Sw-T 106 is designed to be small in order to reduce the pixel area consumed by the Sw-T 106 and increase the pixel area used by the DS-VOLET 103.

The storage capacitor in active matrix arrays that use a thin-film transistor (TFT) architecture driving transistor provides additional charge storage ability to the existing gate capacitance of the driving transistor. The total capacitance, i.e. the sum of the gate and storage capacitor capacitances, should be large enough to retain the majority of the data charge between refreshing events in the operating cycle of the array. The architecture of the DS-VOLET 103 is such that it has a large gated area, and therefore more gate capacitance than needed to retain the majority of the data charge between refreshing events, without a separate storage capacitor. This is because the gated area can be as large as the light emitting area of the AMDS-VOLET pixel 100, which can be most (i.e. greater than 50%) of the AMDS-VOLET pixel 100 area. The DS-VOLET 103 has both a large gated area and aperture ratio because the gate layers and substrate can be transparent, as described below. However, if the gate capacitance becomes too large, there is a concern of insufficient switching speed of the DS-VOLET 103. The larger the gate capacitance, the lower the switching speed. Switching speed measurements are presented below and shown to be sufficiently fast to not limit the switching speed of the AMDS-VOLET pixel 100 in typical display applications.

As shown in FIG. 1A, the DS-VOLET 103 includes a gate layer 109 (denoted herein as 109a), a source layer 113 (denoted herein as 113a), an active layer 116, and a drain layer 119. These layers will be discussed further below in connection with the description of FIG. 1B. The Sw-T 106 is coupled to data conducting line 123a1 that transmits the $V_{data}$ signal, and the Sw-T 106 is also coupled to the gate layer 109a of the DS-VOLET 103 by conducting line 123d. The Sw-T 106 is activated at regular intervals by the scan conducting line 123c coupled to a gate 109 of the Sw-T 106 that provides the $V_{scan}$ voltage signal. The activation of the Sw-T 106 causes the $V_{data}$ signal to be transmitted to the gate layer 109a of the DS-VOLET 103. In this manner, the Sw-T 106 selectively provides a voltage (e.g., $V_{data}$) to the gate layer 109a of the DS-VOLET 103 to control the grayscale of the DS-VOLET 103. The $V_{source}$ and $V_{drain}$ signals respectively provide voltage across the source layer 113a and drain layer 119 of the DS-VOLET 103.

Referring now to FIG. 1B, shown is a cross-sectional view of an embodiment of the active cell 102 illustrated in FIG. 1A, denoted herein as 102a. The active cell 102a includes an embodiment of a Sw-T 106, denoted herein as 106a. The Sw-T 106a is a TFT. The active cell 102a also includes an embodiment of a DS-VOLET 103 (denoted herein as 103a). The DS-VOLET 103a and Sw-T 106a each include a gate layer 109, denoted herein as 109a and 109b, respectively. The gate layers 109a, 109b may be formed according to the same process or independently of each other instead. The gate layers 109a, 109b are in direct contact with the substrate layer 126, which may include a material transparent to visible light. For example, the substrate layer 126 may include a glass, a quartz, a plastic substrate, and/or another transparent material. The substrate layer 126 may be rigid or flexible in nature. Potential plastic materials for the substrate layer 126 include, but are not limited to, polyimide, polyethylene terephthalate (PET), and polyethylene naphthalate (PEN). In some embodiments, the substrate layer 126 may be non-transparent, and the substrate layer 126 may include an insulating material without any restriction on the optical properties of the insulating material. For example, in some embodiments, the AMDS-VOLET pixel 100 may be used in a top emission display, and the substrate layer 126 included in the AMDS-VOLET pixel 100 is non-transparent. The substrate layer 126 may also include a metal such as stainless steel. The metal may be of a certain thickness to allow mechanical flexibility. In an embodiment where the substrate layer 126 includes a metal, an insulating base layer is deposited prior to all other layers to prevent electrical communication between the AMDS-VOLET pixel 100 and the metal substrate layer 126. This insulating base layer may include silicon oxide, silicon nitride or a solution processable insulating polymer such as polyimide. The insulating base layer may be deposited by plasma enhanced chemical vapor deposition (PECVD), atomic layer deposition (ALD), spin coating or another deposition method mentioned below.

Each of the gate layers 109a, 109b includes a gate electrode 201 and a gate dielectric layer 202. The gate layer 109a is shown as a single layer in FIG. 1A for simplicity. The gate electrodes 201 are patterned to correspond to the DS-VOLET 103a and the Sw-T 106a, respectively, and are denoted herein as DS-VOLET gate electrode 201a and Sw-T gate electrode 201b. At least a portion of the gate electrodes 201 are electrically insulated by the gate dielectric layer 202. The gate dielectric layer 202 is patterned to correspond to the DS-VOLET 103a and the Sw-T 106a, respectively, denoted herein as DS-VOLET gate dielectric 202a and Sw-T gate dielectric 202b.

In some embodiments, the gate electrodes 201 include a transparent conducting layer, and the gate dielectric layer 202 includes a transparent dielectric coating. In other embodiments, the gate electrodes 201 are non-transparent. The gate electrodes 201 may include a single layer or multiple layers of a conducting material such as, for example, an organic or inorganic conducting material, a transparent or non-transparent metal, a semi-metal and/or a semiconductor (doped or undoped, preferably doped). The term "conductor" can be used to refer to a semiconducting material or semi-metal that has been doped to increase its carrier density such that it is treated as a conductor. Some examples of materials included in the gate electrodes 201 are: single or multi-layer graphene, a dilute network or a non-dilute layer of carbon nanotubes (CNTs), tin-doped indium oxide (ITO), poly(3,4-ethylene-dioxythiophene) poly(styrene-sulfonate) (PEDOT:PSS), ZnO and/or indium oxide nanoparticles. In some embodiments, the gate dielectric layer 202 may also include a bi-layer of an inorganic material such as aluminum oxide and a polymer such as benzocyclobutene (BCB). The inorganic material provides a large capacitance, and the polymer serves as a hydrophobizing layer. These layers may be deposited by PECVD, ALD, spin coating or other known methods.

In the DS-VOLET 103a, the gate dielectric 202a is positioned on the gate electrode 201a to electrically isolate the gate electrode 201a from other layers included in the DS-VOLET 103a. The DS-VOLET gate electrode 201a and Sw-T gate electrode 201b may be deposited and patterned at the same time. Similarly, the gate dielectric layer 202 may be deposited and patterned for the DS-VOLET gate dielectric 202a and Sw-T gate dielectric 202b at the same time. These layers can also be deposited separately.

In some embodiments, the source layer 113a can include a dilute source material comprising a percolating dilute network. A percolating dilute network can be any dilute and electrically percolating material such as, e.g., any low density of states conductor, nanostructured conductor or semiconductor, nanopatterned conductor or semiconductor, low density of states semiconductor, inorganic or organic; or low density of states semi-metal, inorganic or organic. An example of a low density of states semi-metal is graphene. Graphene may be single layered or multi-layered and may be patterned to include perforations or un-patterned. Another example of a low density of states conductor includes metallic single-wall and multi-wall carbon nanotubes, which have an intrinsic low density of states and can further be deposited in a low density, into what is referred to as a dilute network. Other examples of a low density of states semiconductor include semiconducting carbon nanotubes and most all organic semiconductors. Examples of nanostructured semiconductors include Si nanowires, zinc oxide nanowires, indium phosphide nanowires, gallium nitride nanowires. Examples of nanostructured conductors include silver nanowires, gold nanowires and nickel nanowires. The term organic semiconductor refers to any organic based small molecule, oligomer or polymer known to have semiconducting properties.

As used herein, "dilute network" refers to a thin-film or network included in the source layer 113a having perforations with substantial regions of the dielectric layer 202a not covered by the thin-film or network. The source layer 113a may be sufficiently dilute to expose the underlying surface in the range of, e.g., about 0.1% to about 99.9%, about 30% to about 90%, and about 50% to about 80%. Further, "percolating" refers to: (i) a nanotube or nanowire source layer 113a having a density of nanotubes (i.e., number of nanotubes per unit area) or nanowires that is sufficient to provide electrical continuity from one end of the source layer 113a to the other end or (ii) a conductor, semiconductor, or semi-metal film including frequent perforations (e.g., occurring in the nanometer range, in the picometer range and/or in the micrometer range) but retaining electrical continuity from one end of the source layer 113a to the other end. Dilute can also refer to graphene, which is considered a dilute source material because it has a low density of states and therefore can be used with or without perforations.

Figure 1C:
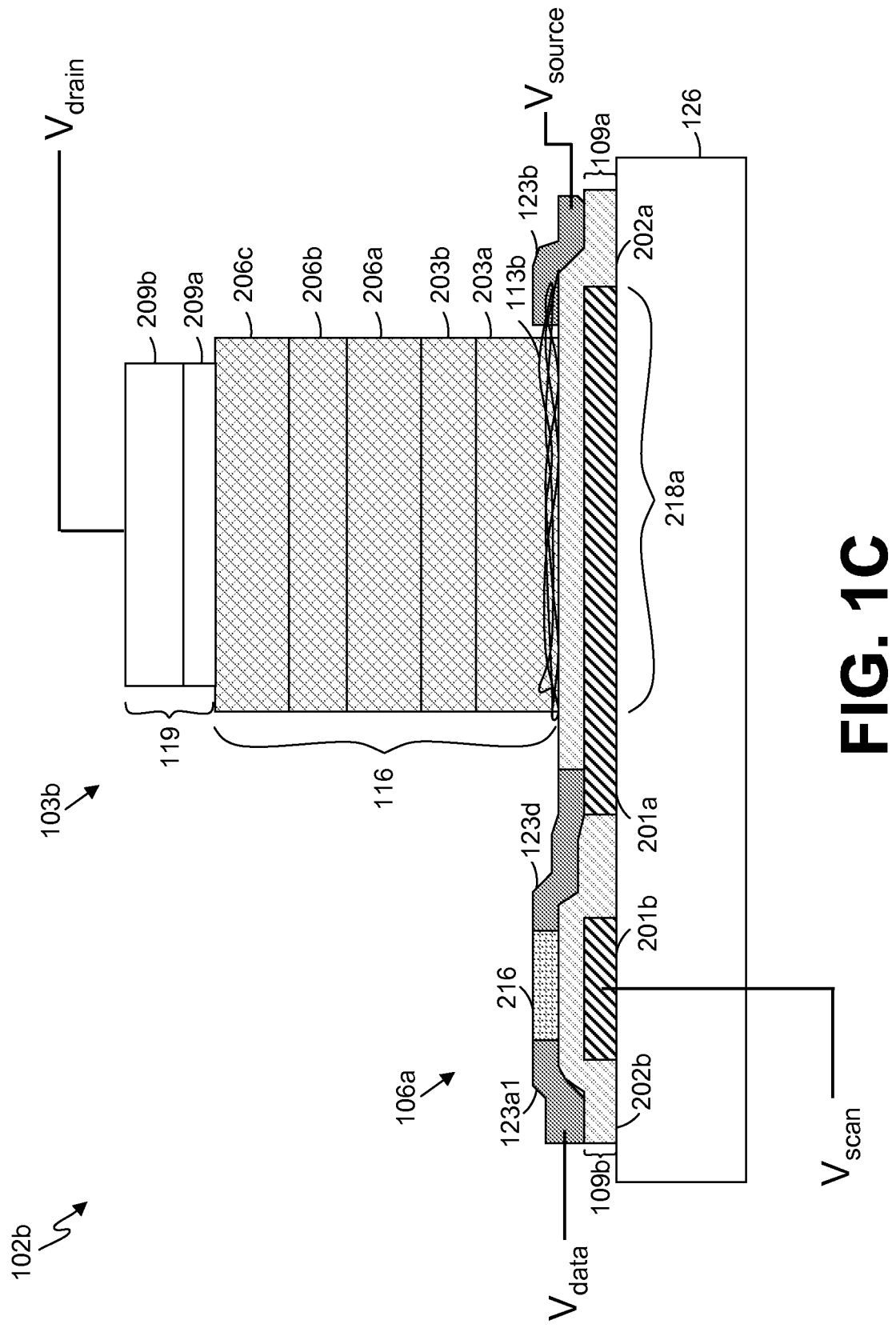

In some embodiments, a dilute network of carbon nanotubes is used as the source electrode of the DS-VOLET 103a. Referring to FIG. 1C, shown is an embodiment of an active cell 102b including a dilute network of single-wall carbon nanotubes as the source layer 113b, which may be referred to as a carbon nanotube-enabled vertical organic light emitting transistor (CN-VOLET) 103b. The dilute nanotube network source layer 113b is positioned on the CN-VOLET gate dielectric 202a over the CN-VOLET gate electrode 201a. Various embodiments of the CN-VOLET 103b, and other embodiments of the DS-VFET and DS-VOLET 103, are described in U.S. Patent Application Publication US 2010/0237336, having Ser. No. 12/677,457, entitled "Nanotube Enabled, Gate-Voltage Controlled Light Emitting Diodes" and filed Sep. 10, 2008; International Publication WO 2011/109693 A2, having International Application No. PCT/US2011/027155, entitled "Semiconductor Devices Including an Electrically Percolating Source Layer and Methods of Fabricating the Same" and filed Mar. 4, 2011; and U.S. Provisional Application entitled "Semiconductor Devices Including a Nanotube Layer and a Memory Layer and Methods of Fabricating the Same" having Ser. No. 61/310,342 and being filed on Mar. 4, 2010, all of which are hereby incorporated by reference herein in their entirety.

Referring back to FIG. 1B, the gate electrode 201a and the source layer 113a define an overlapped region 218a of the substrate 126. The active layer 116 is positioned on the source layer 113a, and the active layer 116 includes at least one organic semiconducting layer 203, which may be doped. In the embodiment illustrated in FIG. 1B, the active layer 116 includes two organic semiconducting layers 203, denoted herein as 203a, 203b. The dilute nanotube network may be deposited by the vacuum filtration transfer method described in [*Science* (2004) 305, pp. 1273-1276] or by at least one of the following methods: spin-coating, dip coating, drop casting, screen printing, spray coating, vapor jet printing, doctor-blading, chemical vapor deposition, gravure printing, flexography and ink-jet printing.

The active layer 116 further includes at least one light emitting layer 206. In the embodiment illustrated in FIG. 1B, the active layer 116 includes three examples of light emitting layers 206, denoted herein as 206a, 206b, and 206c. The light emitting layers 206 are positioned on the at least one organic semiconducting layer 203. In the embodiment illustrated in FIG. 1B, the light emitting layer 206a is positioned on the at least one organic semiconducting layer 20b. The light emitting layer 206a is a hole transport layer (HTL), and the light emitting layer 206b, which is an electroluminescent layer (EL), is positioned on the light emitting layer 206a. The light emitting layer 206c, which is an electron transport layer (ETL), is positioned on the light emitting layer 206b. The light emitting layers 206 may be doped or undoped. Additional layers (not shown in FIG. 1B) can be added and positioned on the at least one organic semiconducting layer 203, beneath the HTL 206a such as one or more doped or undoped hole injection layers. The active layer 116 may include any organic (small molecule or polymer) or inorganic semiconductor. In some embodiments, the light emitting layer 206b is a fluorescent or phosphorescent light emitting doped or undoped organic or inorganic semiconductor material. Examples of materials included in the light emitting layer 206b are fac-tris(2-phenylpyridinato)iridium(III) (Ir(ppy)$_3$) doped into 4,4-N,N-dicarbazole-biphenyl (CBP). In some embodiments, the light emitting layer 206a includes 1,1-bis[(di-4-tolyamino)phenyl]cyclohexane (TAPC) or N,N'-di(1-naphthyl)-N,N'-diphenyl-1,1'-diphenyl-1,4'-diamine) (NPD). In some embodiments, the light emitting layer 206c includes tris[3-(3-pyridyl)-mesityl]porane (3TPYMB).

The drain layer 119 is positioned on the active layer 116. Specifically, the drain layer 119 is positioned on the at least one light emitting layer 206 included in the active layer 116. In some embodiments, such as the one illustrated in FIG. 1B, the drain layer 119 includes two conducting layers 209, denoted herein as 209a, 209b. The conducting layer 209a may serve as an electron injection layer (EIL) to the light emitting layer 206c. The conducting layer 209b may include aluminum, another metal, and/or a transparent conducting material. In some embodiments, the drain layer 119 is also a single layer, a bi-layer, or a multi-layer of various conducting materials such as an organic or inorganic conducting material, a transparent or non-transparent metal, a semi-metal or semiconductor (doped or undoped, preferably doped). Some examples of materials included in the drain layer 119 are: single or multi-layer graphene, a dilute network or a non-dilute layer of carbon nanotubes, aluminum, lithium fluoride, tin-doped indium oxide (ITO), molybdenum oxide, poly(3,4-ethylenedioxythiophene) poly(styrene-sulfonate) (PEDOT:PSS), ZnO or indium oxide nanoparticles or metallic nanoparticles. In some embodiments, the active layer 116 of the DS-VOLET 103a further includes an electron blocking layer positioned between the light emitting layer 206a and the light emitting layer 206b.

In the case where the DS-VOLET 103 emits light through the drain layer 119, which may be referred to as a top-emitting DS-VOLET 103, ITO can be used because it is a transparent conductor. However because ITO is typically deposited by sputtering, it is typically damaging to the organic light emitting layers below. To protect the light emitting layers below, molybdenum oxide or another metal oxide can be thermally evaporated prior to deposition of the ITO, as these inorganic metal oxides provide a protective barrier against the high energy bombardment of material during the ITO sputter deposition which can be done after the metal oxide deposition. Additionally, other embodiments may include combinations of, or modifications to, the above mentioned layers as well as additional layers or omissions thereof.

Figure 2A:
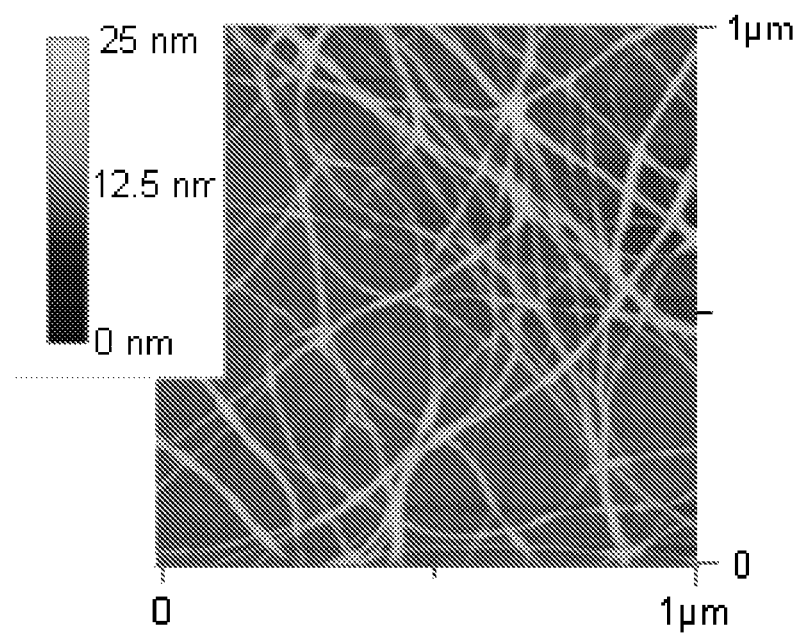
FIG. 2A is an atomic force microscope (AFM) image of an example of a dilute carbon nanotube (CNT) network that may be included in an AMDS-VOLET in accordance with various embodiments of the present disclosure.
Figure 2B:
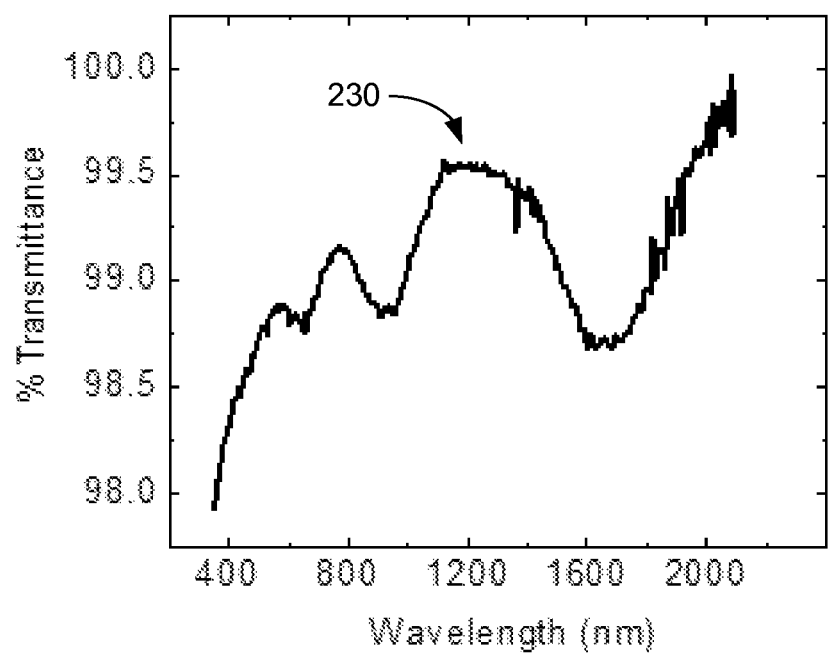
FIG. 2B is a plot of transmittance vs. wavelength for a CNT network of FIG. 2A in accordance with various embodiments of the present disclosure.

Referring to FIG. 2A, shown is an atomic force microscope (AFM) image of a CNT network with a CNT surface number density typical of that used for the source layer 113b of an embodiment of the CN-VOLET 103b. As indicated in FIG. 2B, dilute CNT networks with about this surface number density have a very high transmittance 230, which is beneficial for allowing the light generated in the electroluminescent light emitting layer 206b of some embodiments of the CN-VOLET 103b to escape such that the energy efficiency of the CN-VOLET 103b is minimally impacted (on the order of 1%) by transmittance losses incurred by the CNT source layer 113b. The transmittance of the dilute network shown in FIG. 2A through the visible and near-infrared spectrum is shown in FIG. 2B and is greater than 98% in the visible wavelengths.

As illustrated in FIGS. 1B and 1C, in some embodiments, the active layer 116 includes two organic semiconducting layers 203, denoted herein as 203a and 203b. The organic semiconducting layer 203a may include a polycrystalline organic semiconducting material, and organic semiconducting layer 203a coats at least a portion of the source layer 113 of the DS-VOLET 103. For instance, the coating of the source layer 113b of FIG. 10 results in a very rough top surface morphology of the organic semiconducting layer 203a due, at least in part, to the nanotubes included in the source layer 113b.

For example, pentacene that is grown directly onto the carbon nanotube source layer 113b nucleates polycrystalline grains that differ in orientation over the nanotubes versus the exposed CN-VOLET gate dielectric 202a adjacent to the nanotubes of the source layer 113b. The specific orientation of the grains nucleated on the nanotubes orients the high mobility plane of the organic semiconducting layer 203a to coincide with the direction in which current flows for operation of the CN-VOLET 103b. Therefore, the direction of the high mobility plane is highly favorable to the performance of the CN-VOLET 103b. The high mobility grains over the nanotubes are also the grains that grow the fastest and, therefore, the fast growing grains create high points in the final surface topology after the deposition of the organic semiconducting layer 203a.

Figure 3:
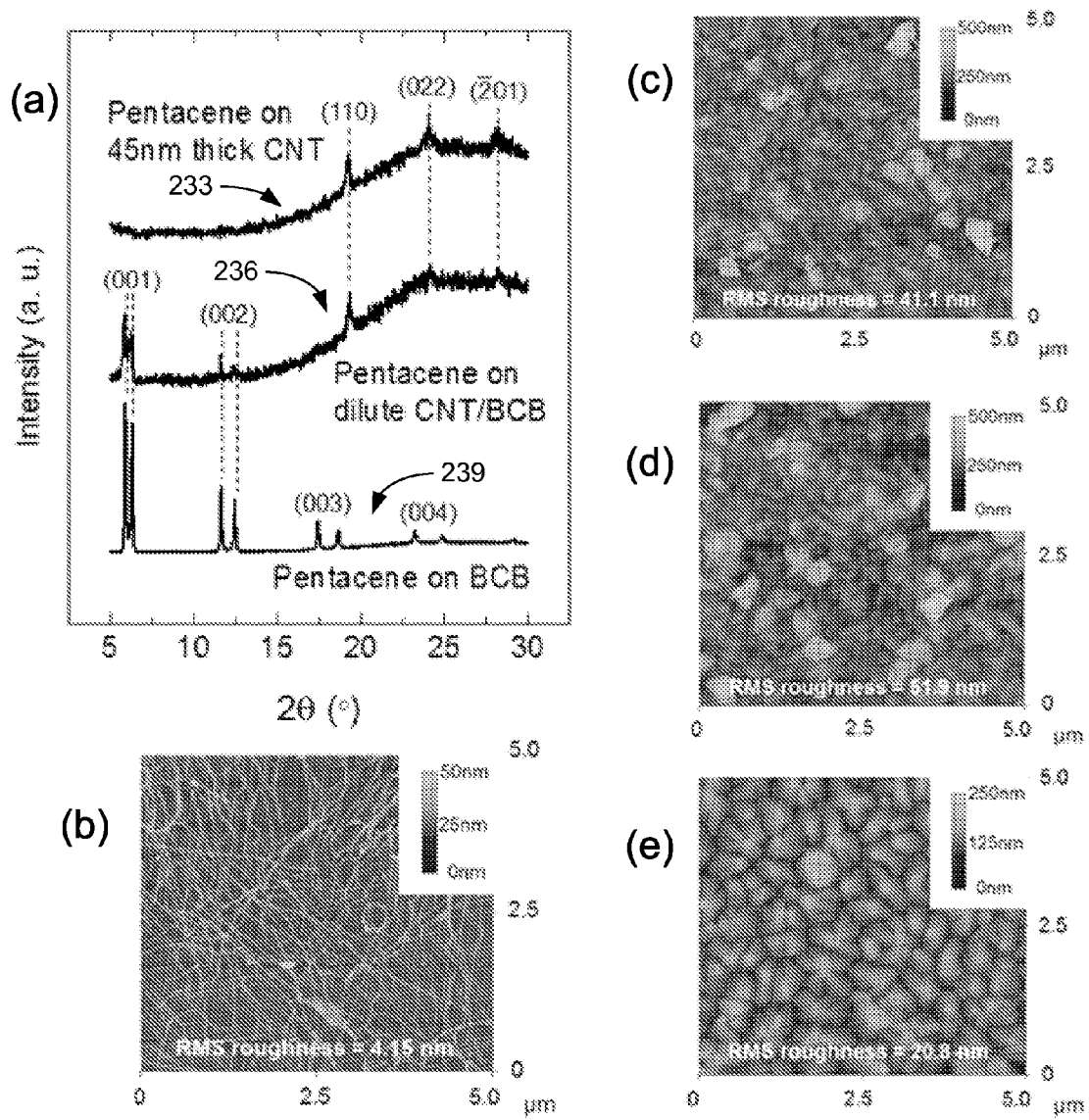
FIG. 3 illustrates X-ray diffraction (XRD) and atomic force microscopy (AFM) evidence for the reorientation of the pentacene poly-crystalline grains grown on dilute CNT networks of FIG. 2A in accordance with various embodiments of the present disclosure.
Figure 4:
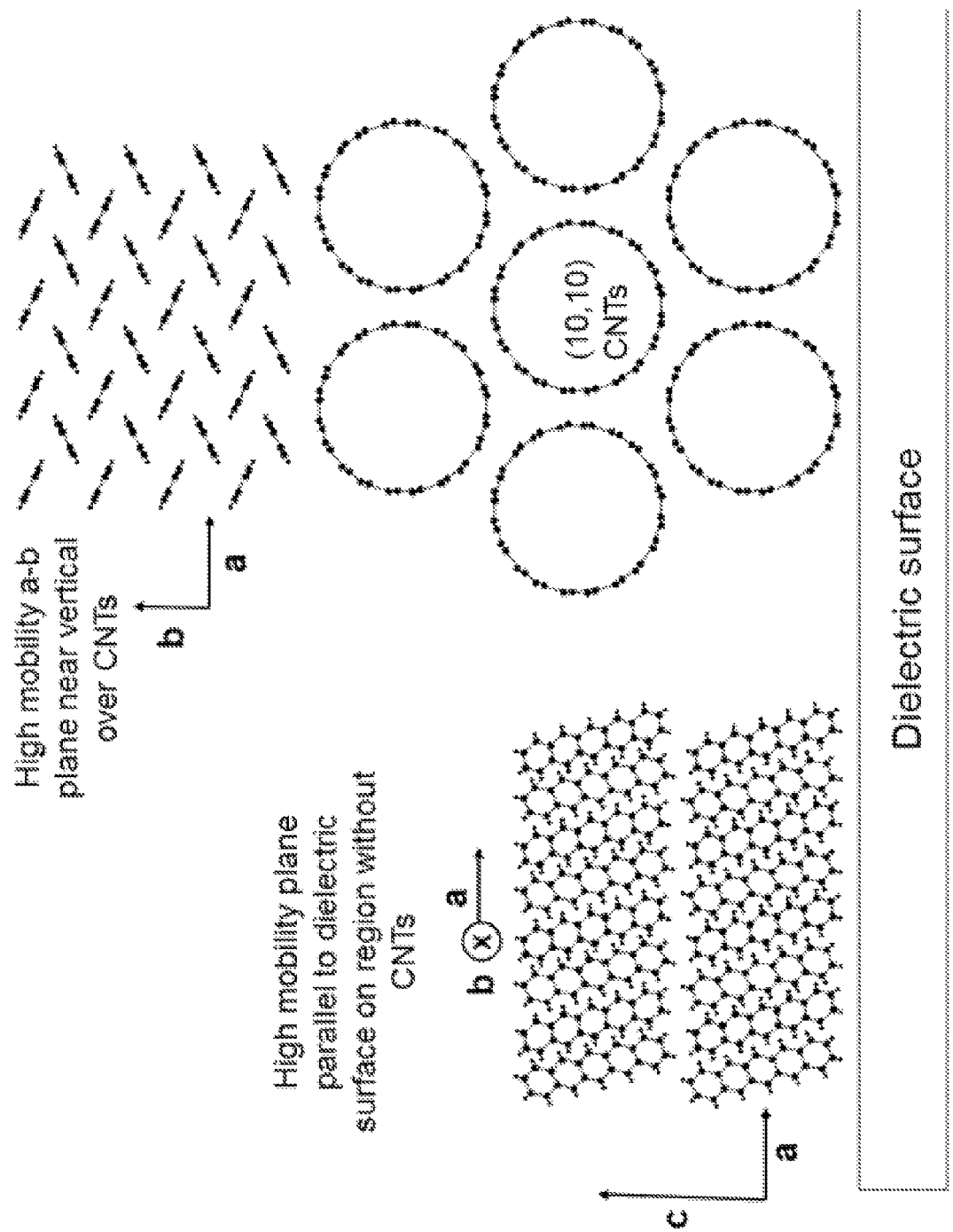
FIG. 4 illustrates pentacene planar orientation on a surface in accordance with various embodiments of the present disclosure.

X-ray diffraction (XRD) and atomic force microscopy (AFM) evidence for the reorientation of the pentacene polycrystalline grains grown on dilute CNT networks is illustrated in FIG. 3. Pentacene was grown to a thickness of 560 nm at 1 Å/s in a vacuum thermal evaporation chamber onto three substrate types: 1) a dilute CNT network on BCB coated glass, 2) a 45 nm thick CNT film on glass and 3) a BCB coated glass substrate with no CNTs present. The 45 nm thick film allowed experimentation of pentacene growth on a surface with no BCB areas present as is the case with a dilute CNT network used in a CN-VOLET as the CNTs of a 45 nm thick CNT film coat effectively the entire substrate surface. The XRD data 233, 236, and 239 in FIG. 3(a) are consistent with the pentacene grains with their a-b plane oriented in the near vertical direction over the areas of the substrate with CNTs, and with their a-b plane oriented parallel to the substrate in regions over the bare dielectric regions in between CNTs. FIG. 3(b) shows an AFM image of the dilute CNT network on a BCB coated glass substrate. The CNT surface number density in FIG. 3(b) is similar to that used in the source electrode for some embodiments of the CN-VOLET 103b. The lack of lower order peaks in the XRD data 233 of FIG. 3(a) for the 45 nm CNT sample shows that when there are no areas of BCB exposed, there are no grains oriented with their a-b planes parallel to the surface. In FIG. 3(a), the XRD data 236 for pentacene on dilute CNT on BCB sample show XRD peaks from both grain orientations: grains with their a-b plane parallel and grains with their a-b plane near perpendicular to the substrate surface. The bare BCB XRD peaks in the XRD data 239 indicate only the presence of pentacene grains with their a-b planes parallel to the surface. This is indicative of the CNTs nucleating a reorientation of the pentacene grains to the near vertical direction; a direction which is favorable for charge transport in the CN-VOLET 103b enhancing its performance. The AFM images of FIGS. 3(c) and 3(d) of the pentacene surface of pentacene grown on a 45 nm CNT film and a dilute CNT network on BCB show large root-mean-square (RMS) surface roughness values of 41.1 nm and 51.9 nm, respectively. These RMS roughness values are significantly larger than the 20.8 nm RMS roughness measured for the pentacene on bare BCB sample AFM image in FIG. 3(e). The AFM data 233, 236, and 239 show that the presence of CNTs on the substrate surface with pentacene subsequently grown on top, significantly increases the surface RMS roughness of the pentacene. When the pentacene a-b plane is oriented in the near vertical direction the pentacene molecules are lying with their long axis parallel to the CNT long axis, as depicted in the drawing in FIG. 4

Referring to the embodiment illustrated in FIG. 1C, a RMS surface roughness of >30 nm (e.g., as measured in the AFM image in FIG. 3(d)) results in outliers (areas of the film of extreme highness or lowness) as high as 120 nm above and as low as 120 nm below the average thickness of the organic semiconducting layer 203a. These regions of the surface that protrude or descend from the average thickness of the organic semiconducting layer 203a span a range that is larger than the total thickness of all the light emitting layers 206 (i.e., 206a, 206b and 206c). This surface roughness may result in direct shorts across the light emitting layers 206, resulting in a non-operational or reduced luminance current efficiency AMDS-VOLET pixel 100.

To overcome this issue of direct shorts, an amorphous, solution-processable organic semiconducting layer 203b may be deposited as a planarization layer. In some embodiments the solution processable amorphous organic semiconductor poly[9,9-dioctyl-fluorene-co-N-(4-butylphenyl)-diphenylamine] (TFB) can be used for the planarization layer and serve as the organic semiconducting layer 203b. TFB can be spun coat from toluene or other solvents onto a rough polycrystalline small molecule organic surface. An example for such planarization by TFB of the rough polycrystalline surface is illustrated in FIG. 5. FIG. 5(a) shows the rough bare polycrystalline organic surface before planarization, with a RMS surface roughness of 27 nm. The surface of FIG. 5(a) was made smoother than the 51.9 nm RMS surface roughness of FIG. 3(d) by modifying the growth conditions. FIG. 5(b) shows the same surface of FIG. 5(a) after planarization with TFB; resulting in a reduced RMS roughness of 10.5 nm.

As an experiment of the effectiveness of this planarization, CN-VOLET devices 103c with the structure illustrated in FIG. 6 were fabricated with and without the TFB planarization layer and the device performance was compared. In the fabricated examples of FIG. 6, the substrate 126 is glass; the gate electrode 201a is tin doped indium oxide (ITO); the dielectric layer 109a is a bi-layer with first an atomic layer of deposited aluminum oxide 202a and second a layer of BCB 202d; the source layer 113b was a dilute CNT network with CNT surface number density similar to that shown in the AFM image of FIG. 3B; the first organic semiconducting layer 203a is a small molecule polycrystalline organic; the second organic semiconducting layer 203b is TFB; the third organic semiconducting layer 203c (the hole injection layer) is NPD co-doped with molybdenum oxide; the hole transporting light emitting layer 206a is NPD; the electroluminescent light emitting layer 206b is CBP co-doped with Ir(ppy)3; the electron transporting light emitting layer 206c is 3TPYMB; the electron injecting conducting layer 209a is lithium fluoride; and the metal conducting layer 209b is aluminum. In the illustration of FIG. 6, the polycrystalline organic semiconductor layer 203a is shown with spikes which represent its rough surface.

Figure 7:
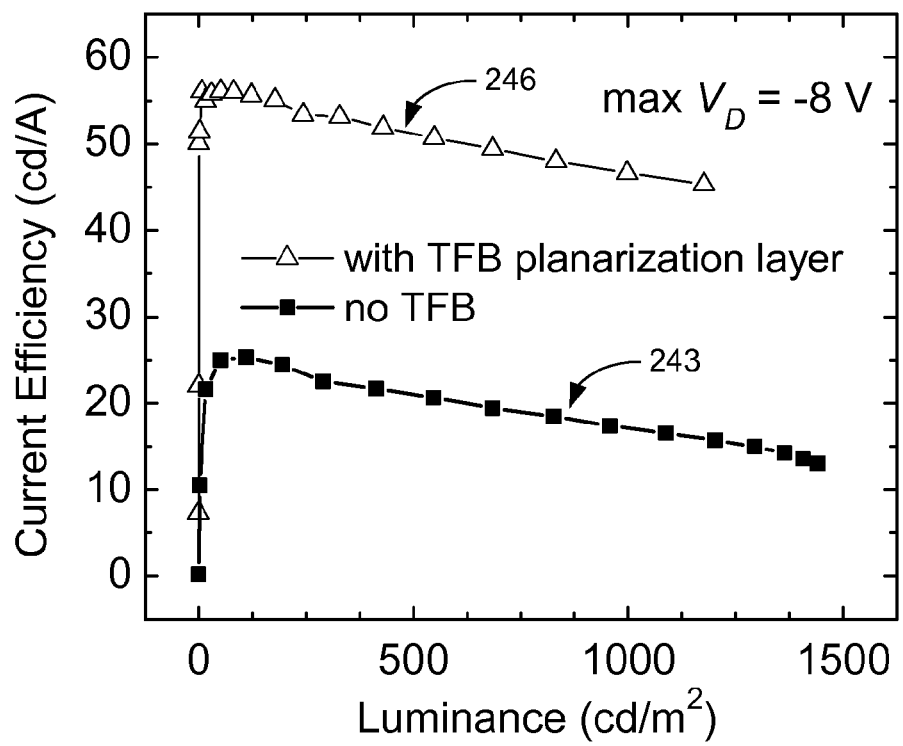
FIG. 7 is a plot illustrating the improvement in current efficiency with a TFB planarization layer of FIG. 5 in an active cell of FIG. 6 in accordance with various embodiments of the present disclosure.

FIG. 7 illustrates the improvement in the current efficiency with a TFB planarization layer as measured in units of candelas/amp (Cd/A) and plotted as a function of the luminance of the tested CN-VOLETs 103c (FIG. 6), where luminance is in units of candelas per square meter (Cd/m$^2$). The drain voltage ($V_D$) was swept from 0 V to −9 V, and the gate voltage ($V_G$) was held constant at −3 V. Without the TFB planarization layer, the current efficiency 243 is reduced my more than a factor of two. This reduction in the current efficiency is attributed to direct shorts between the first organic semiconducting layer 203a and the conducting layers 209a and 209b in the CN-VOLET device 103c without TFB resulting from the rough polycrystalline organic semiconducting layer surface. The CN-VOLET device 103c with TFB has more than twice the current efficiency 246 than without TFB because the organic semiconducting layers 203a and 203b together are smooth enough to allow sufficient coverage of the subsequently deposited hole injection layer 203c and light emitting layers 206a, 206b and 206c to force the current to travel through the light emitting layers 206a, 206b and 206c and therefore have a higher current efficiency.

Note, however, that amorphous solution-processable organic semiconductor materials cannot match the mobility of the polycrystalline semiconductor materials. The fact that the high mobility orientation grains of the polycrystalline semiconductor materials are the highest features in the topography of the organic semiconducting layer 203a allows the use of a restricted thickness of the organic semiconducting layer 203b, which may fill in around the highest features while lightly coating them, thereby reducing any loss in performance due to such a layer. The organic semiconducting layer 203b may further be doped by a co-soluble dopant and/or interfacial dopants may be deposited before and/or after deposition of this planarization layer. Potential dopants include $SbCl_5$, $WO_3$, molybdenum oxide, $ReO_3$, iron III chloride, iron oxide, 2,3,5,6-tetrafluoro-7,7,8,8-tetracyanoquinodimethane (F4TCNQ), 1,3,4,5,7,8-hexafluorotetracyanonaphthoquinodimethane (F6-TNAP) and 3,6-difluoro-2,5,7,7,8,8-hexacyanoquinodimethane (F2-HCNQ). The organic semiconductor layer 203a may include a doped or undoped polymer such as TFB or Poly[N,N'-bis(4-butylphenyl)-N,N'-bis(phenyl)-benzidine] (poly-TPD). In alternative implementations, the organic semiconductor layer 203a may include a highly conducting polymer such as poly(3,4-ethylenedioxythiophene) poly(styrene-sulfonate) (PEDOT:PSS) or a solution-deposited nanoparticle layer.

The roughness of the planarized surface shown in FIG. 5(b) is 10.5 nm. In some applications this roughness may be too large thereby preventing high performance devices to be attained upon subsequent deposition of the light emitting layers and drain layers. This roughness may be reduced by spin coating a second planarization layer on top of the first. Before spin coating, the first layer is made insoluble to the second layer. One way to do this is to cross-link the first planarization layer and make it insoluble to its original solvent thereby allowing the same polymer and solvent solution to be used a second time. TFB is known to be cross-linkable above a certain temperature during an annealing process for an appropriate time period, which means TFB can be used as the cross-linkable first and second planarization layer, so long as it is cross-linked by the appropriate treatment prior deposition of the second TFB layer. As was mentioned earlier, the carrier mobility of TFB is lower than the polycrystalline semiconductor layer, and because of this, the use of multiple polymer planarization layers may increase the series resistance of the device increasing its power consumption more than is tolerable. Doping the polymer planarization layer is one way to alleviate this. However, with two polymer planarization layers, the second one can be more heavily doped than the first. There is an upper limit to how much the first planarization layer can be doped, because past a certain point, the on/off ratio of the DS-VOLET will begin to suffer because of an increased off-state current due to the carrier density being too high. The cross linking of the first polymer planarization layer will protect the more heavily doped second polymer planarization layer from contaminating the lower layers of the DS-VOLET. Having the second polymer layer doped more heavily can minimize its adverse impact on the power consumption of the DS-VOLET.

Further, in some embodiments, the organic semiconductor layer 203a and light emitting layers 206a, 206b, and 206c may be deposited by thermal evaporation. Also, the organic semiconducting layer 203b may be deposited by spin coating. In other embodiments, a soluble high mobility wide band-gap organic small molecule may be applied in solution to serve as the organic semiconducting layer 203a by any of the below mentioned methods. High mobility refers to a field effect carrier mobility of about 0.01 $cm^2V^{-1}s^{-1}$. With a wide-band gap, the thin film solid phase of the organic small molecule does not absorb visible light. The organic small molecule may form localized polycrystalline grains during and after drying of the solvent which allow it to attain a high mobility. Note, however that the viscosity of such solutions including a dissolved organic small molecule material can be low; so low that a sufficient thickness of the material is not achievable in a spin coating or other technique as mentioned below even after increasing the concentration of the organic small molecule to the point of saturation. To increase the viscosity a soluble amorphous polymer such as TFB or poly-TPD may be added in a controlled amount to increase the viscosity of the soluble organic small molecule solvent solution so that it allows the chosen deposition method to achieve proper film thickness and morphology. A solution deposited small molecule organic semiconducting layer 203a with or without a polymer thickener may be at least as smooth as—and likely smoother than—the surface of a polymer planarized thermally evaporated small molecule organic semiconducting layer 203a. In other embodiments the organic semiconducting layer 203a can be comprised of a wide band-gap, high mobility oligomeric or polymeric material that may form localized polycrystalline grains during and after drying of the solvent through one of the below mentioned deposition methods. These localized polycrystalline grains may allow the deposited thin-film to attain high mobility. A solution deposited oligomeric or polymeric organic semiconducting layer 203a may be at least as smooth as—and likely smoother than—the surface of a polymer planarized thermally evaporated small molecule organic semiconducting layer 203a. In some embodiments, any of the following solution processable and non-solution processable methods may be used to deposit at least one of the organic semiconducting layers 203 and the light emitting layers 206: spin-coating, dip coating, drop casting, screen printing, spray coating, vapor jet printing, physical vapor deposition, thermal gradient sublimation, doctor-blading, gravure printing, flexography, thermal evaporation and ink-jet printing.

The conducting lines 123, including the data conducting line 123a (i.e., providing the $V_{data}$ voltage signal), denoted herein as 123a1 and 123a2, source conducting line 123b (i.e., providing the $V_{source}$ voltage signal) and scan conducting line 123c (i.e., providing the $V_{scan}$, voltage signal), may be made of at least one of the following: metal, carbon paste with or without incorporation of conducting nanoparticles, solution processable conducting polymers such as poly(3,4-ethylenedioxythiophene) poly(styrene-sulfonate) (PEDOT:PSS), solution deposited conducting nanoparticles, and pastes incorporating conducting nanoparticles. Methods of depositing the conducting lines 123 include: sputtering, thermal evaporation, e-beam evaporation, electroplating, spin-coating, dip coating, drop casting, doctor-blading, screen printing, spray coating, gravure printing, flexography, paste deposition through a nozzle and ink-jet printing. A data conducting line 123a has an interlayer dielectric (ILD) between itself and the source conducting line 123b and scan conducting line 123c in the region of overlap to prevent electrical communication therebetween. The source conducting line 123b is in electrical contact with the source layer 113a of the DS-VOLET 103. The data conducting line 123a, provides the connection to one side of the Sw-T 106. The other side of the Sw-T 106 connects to the DS-VOLET gate electrode 201a. In some embodiments, the drain layer 119 is a continuous layer along a plurality of active cells 102 in an entire column (to be described in greater detail later). An ILD is deposited in the region of overlap between the drain layer 119 and both the source conducting line 123b and the scan conducting line 123c. The ILD layer may include one or more various organic or inorganic insulating materials. For example, the ILD layer may include silicon oxide, silicon nitride, aluminum oxide, hafnium oxide, BCB, or polyimide. The ILD layer may be deposited by PECVD, ALD, spin coating or another deposition method mentioned above.

Figure 8:
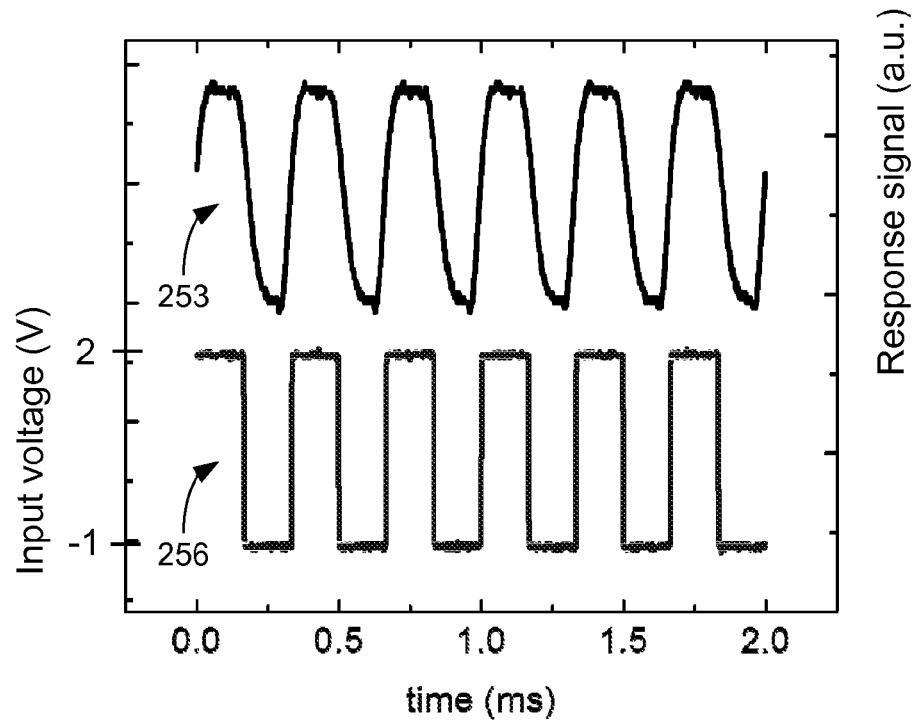
FIG. 8 is a plot illustrating the photodiode response of an active cell of FIG. 6 in accordance with various embodiments of the present disclosure.

The switching speed of an embodiment of the CN-VOLET 103c of FIG. 6 was measured to determine if the cutoff frequency of the CN-VOLET 103c was sufficient for typical display applications. The pixel size was 1 mm by 1 mm—as defined by the overlap of a 1 mm wide CNT source 113b with a 1 mm wide aluminum conducting layer 209b. The parasitic overlap capacitance was estimated to be twice as large as the gate capacitance in the pixel because the overlap area of the CNT source layer 113b with the ITO gate electrode 201a was 1 mm (CNT width) by 3 mm (ITO width)—this gate electrode was 3 times wider than needed to aid in expedient device fabrication without much concern of layer alignment, however it may be decreased to decrease the parasitic capacitance. The device was given a constant voltage between the CNT source 113b and aluminum conducting layer 209b. The ITO gate electrode 201a was connected to a function generator supplying a square wave voltage signal, oscillating the CN-VOLET 103c between its on and off states. The flashing light being emitted from the CN-VOLET 103c was measured with a Si photodiode connected to a high speed amplifier whose signal was read by an oscilloscope. FIG. 8 shows the photodiode response 253 and input signal 256 of the CN-VOLET at a frequency of 3 kHz. The cutoff frequency was taken at 3 db of attenuation of the photodiode response and was measured to be about 9.1 kHz. Considering a parasitic capacitance twice the size of the pixel gate capacitance, the switching speed of a properly designed 1 mm by 1 mm pixel without this parasitic capacitance would likely be three times this amount—about 27 kHz. Typical side dimensions of typical display pixels for hand held devices and televisions are in the range of about 100 µm to about 400 µm. As the 1 mm by 1 mm pixel size is reduced, the switching speed is inversely increased. The corresponding increase in switching speed for dimensional reduction of the CN-VOLET 103c (FIG. 6) down to the typical hand held display and television display pixel sizes results in values of about 2.7 MHz and about 200 kHz, respectively. Considering the latter case, with its lower switching speed, a 1920×1200 pixel WUXGA large screen high definition television display needs about 72 kHz for a 60 Hz screen refresh rate. Therefore it is expected that the CN-VOLET 103c has sufficient switching speed for most display applications including large size high definition television displays.

The architecture of the DS-VOLET 103 has intrinsic benefits concerning its switching speed. By virtue of the difference in architecture between the DS-VOLET and a conventional TFT, the DS-VOLET is not governed by the same physical processes that limit the switching speed of a conventional TFT. The architecture of a typical TFT is such that the rate of charging and discharging of the gate charge is limited by the resistance of its channel, which when the TFT is in the off state is very high. The DS-VOLET however is not limited by the resistance of its channel, it is mainly limited by the resistance of the source layer 113a, which is relatively low and nearly constant whether the device is in the on or off state. As is well known by those skilled in the art, in a TFT the calculated cutoff frequency $f_{Tc}=g_m/(2\pi C_g)$, where $g_m$ is the transconductance and $C_g$ the gate capacitance. In an attempt to calculate the switching speed of the DS-VOLET with the known $f_{Tc}$ equation for conventional TFTs, it was found that the calculated $f_{Tc}$ significantly underestimates the actual cutoff frequency measured for the exemplary embodiment of the DS-VOLET 103 when a dilute CNT network is used as the source electrode 113b comprising the CN-VOLET 103c. The calculation using $f_{Tc}=g_m/(2\pi C_g)$, and plugging in the separately measured CN-VOLET 103c parameters of $g_m=32$ µA/V and $C_g=3.7$ nF, the calculated $f_T=1.3$ kHz, which is almost an order of magnitude lower than the measured cutoff frequency $f_{Tm}$ of 9.1 kHz. However, a model that comes closer to the measured cutoff frequency is that for a typical parallel RC circuit of resistance R and capacitance C, were the RC cutoff frequency $f_{Rc}=1/(2\pi RC)$, and for the CNT series resistance measured for device of R=5 kohms and C=3.7 nF, $f_{Rc}$ is calculated to be 8.6 kHz, which is much closer to the measured value of 9.1 kHz. The better agreement with the RC model is expected seeing as the charging and discharging of the CN-VOLET gate is limited by the series resistance of the source layer, which schematically is connected in series with the capacitor defined by the overlap area 218a of its gate electrode and its active area (i.e. the area consisting of the source layer 113b and organic semiconducting layer 203a in the open regions between CNTs where layer 203a makes direct contact with the dielectric layer 202a in the embodiment where the source layer 113a comprises CNTs) giving it it's gate capacitance. Because the CN-VOLET is likely to fit the parallel RC circuit model, its speed can likely be increased simply by lowering its gate capacitance by increasing the thickness or decreasing the dielectric constant of the dielectric layer 202a, which comes with the expense of a larger operating gate voltage. However, reducing the gate capacitance in an attempt to increase the cutoff frequency of a conventional TFT does not work, because of the physics involved in the governing model for TFTs, which is known by those skilled in the art.

As discussed above, the AMDS-VOLET pixel 100 layout enables a larger aperture ratio for the AMDS-VOLET pixel 100 for at least the reason that the driving transistor is included in the same stack as the light emitting layers 206, which allows more area of the AMDS-VOLET pixel 100 to be devoted to emitting light. However, along with the larger area of light emitting layer 206 coverage enabled by the DS-VOLET 103 in the AMDS-VOLET pixel 100, the capacitance between the source layer 113a and the gate electrode 201a, hereby referred to as the gate capacitance, is larger than is necessary in some embodiments. A larger than necessary gate capacitance may limit the switching speed of the AMDS-VOLET pixel 100 and potentially limit the usefulness of the AMDS-VOLET pixel 100 in some applications.

For the purposes of increasing the switching speed, the gate capacitance of a DS-VOLET 103 may be decreased by using a dielectric layer 202a having a lower dielectric constant, and/or increasing the thickness of the dielectric layer 202a. However, increasing the switching speed by either of these methods comes at the expense of a proportional increase in the gate voltage. A proportional increase in gate voltage could potentially limit the usefulness of the AMDS-VOLET pixel 100 in some applications. In alternative implementations, the gate capacitance of the DS-VOLET 103 may be decreased by reducing the areal coverage on the substrate 126 of the overlapped region 218a between the gate electrode 201a and the source layer 113a, thereby reducing the gate capacitance of the DS-VOLET 103 in a manner that does not bring with it a proportional increase in gate voltage. Reducing the gate capacitance in this manner allows the switching speed of the AMDS-VOLET pixel 100 to be increased without the limiting drawbacks of a larger gate voltage. However, to maintain a large aperture ratio whilst reducing the overlap area 218a, a transitional conducting layer may be added.

Figure 9A:
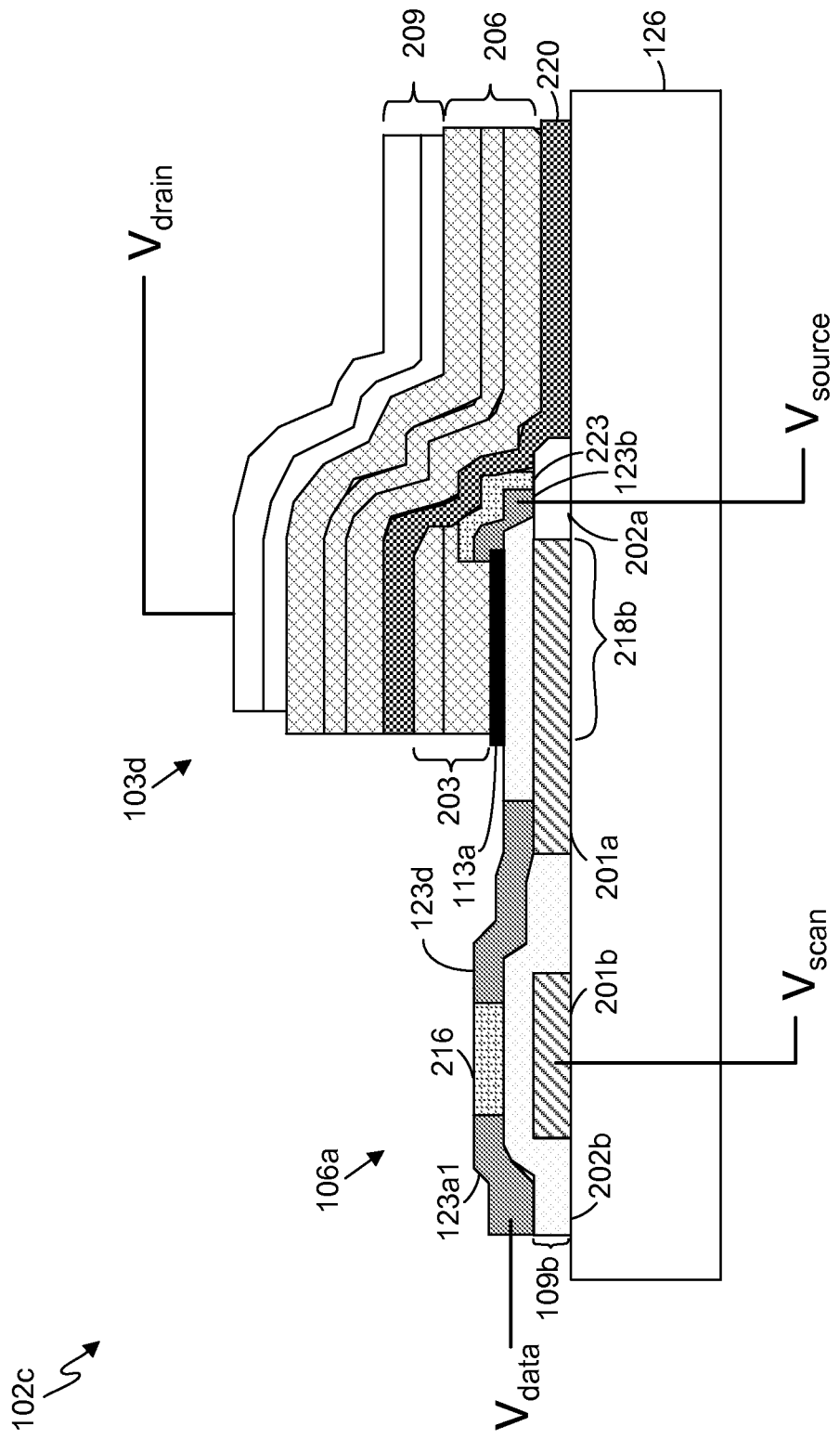
FIGS. 9A and 9B are cross-sectional views of examples of active cells of the AMDS-VOLET pixel of FIG. 1A in accordance with various embodiments of the present disclosure.
Figure 9B:
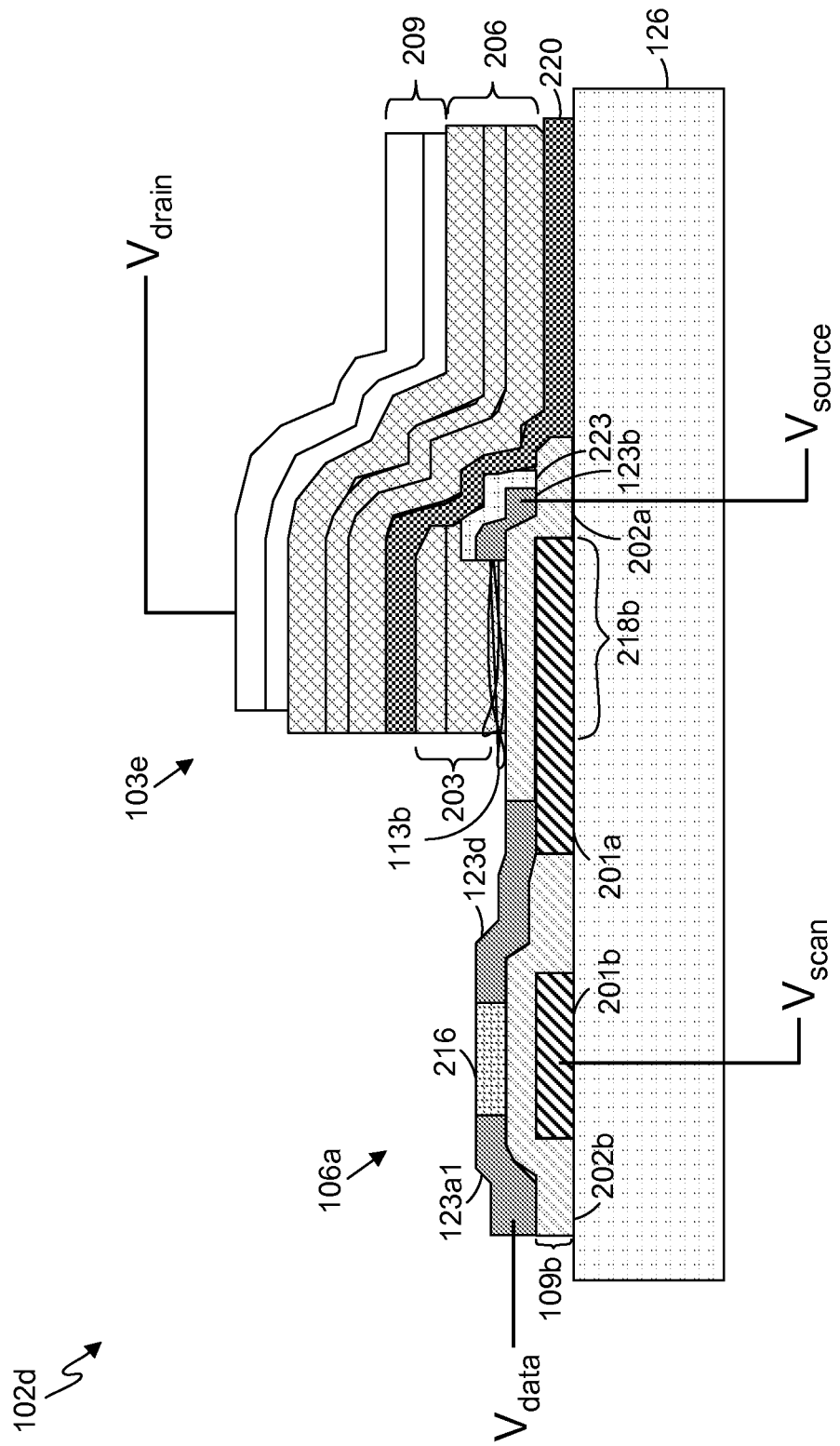

Referring next to FIG. 9A, shown is a cross-sectional view of another embodiment of the active cell 102 illustrated in FIG. 1A, denoted herein as 102c, that includes an example of a DS-VOLET 103, denoted herein as 103d. The DS-VOLET 103d illustrated in FIG. 9A differs from the DS-VOLET 103a illustrated in FIG. 1B in several ways. For example, the gate electrode 201a and the source layer 113a define an overlapped region 218b, which has a smaller area than the overlapped region 218a illustrated in FIG. 1B. Additionally, the DS-VOLET 103d further includes a transitional conducting layer 220 positioned between the light emitting layer 206 and the organic semiconductor layer 203. An ILD layer 223 is positioned between the transitional conducting layer 220 and the source conducting line 123b. Referring to FIG. 9B, shown is an embodiment of an active cell, denoted as 102d, that includes an example of a CN-VOLET 103, denoted herein as 103e. The CN-VOLET 103e includes a dilute network of single-wall carbon nanotubes as the source layer 113b that is positioned on the CN-VOLET gate dielectric 202a over the CN-VOLET gate electrode 201a. As in the DS-VOLET 103d of FIG. 9A, the CN-VOLET 103e includes a transitional conducting layer 220 positioned between the light emitting layer 206 and the organic semiconductor layer 203.

The transitional conducting layer 220 transfers the electrical current from the organic semiconducting layer 203, which is positioned over the source layer 113a, the gate dielectric layer 202a, and the gate electrode 201a, to the light emitting layers 206, which are deposited over a larger area, thereby allowing the light emitting region to occupy substantially all of the available area in the AMDS-VOLET pixel 100. The ILD layer 223 prevents electrical shorting between the source conducting line 123b and the transitional conducting layer 220. The transitional conducting layer 220 may include one or more layers of any conducting material such as an organic or inorganic material, a transparent or non-transparent metal, a semi-metal or semiconductor (doped or undoped, preferably doped). Some examples of materials for the transitional conducting layer 220 include: a single or multi-layer of graphene, a dilute network or a non-dilute layer of carbon nanotubes, tin doped indium oxide, poly(3,4-ethylenedioxythiophene) poly(styrene-sulfonate) (PEDOT:PSS), ZnO, or indium oxide nanoparticles.

In some embodiments, the transitional conducting layer 220 is transparent to the light emitted by the light emitting layers 206. In some embodiments, the transitional conducting layer 220 is a nontransparent conductor such as a metal. In those nontransparent embodiments, the drain layers 209 may include a transparent material, and the AMDS-VOLET pixel 100 may be included in a top light emitting display, where the light generated in the light emitting layers 206 would transmit through the transparent drain layers 209. Additionally, the reflection of light on the metallic transitional conducting layer 220 reduces light out-coupling losses of the AMDS-VOLET pixel 100. In alternative implementations, the top surface of the transitional conducting layer 220 could be made non-reflective and may be black in color so as to improve the contrast ratio of the AMDS-VOLET when ambient light is irradiated to the AMDS-VOLET pixel 100; this could be accomplished with a bi-layer of first a metal and then a black conductive coating such as for example: amorphous carbon, carbon nanotubes, graphene, graphite, PEDOT:PSS or $C_{60}$.

Further, such an embodiment including a transitional conducting layer 220 may become particularly useful when the driving transistor layers of the DS-VOLET 103 (i.e., 201a, 202a, 113a, 203a and 203b) are sensitive to the light emitted from the light emitting layers 206, or external light encountered by the AMDS-VOLET pixel 100 in use in the environment. In those embodiments, the transitional conducting layer 220 also provides a barrier to light that improves the stability of the AMDS-VOLET pixel 100. In such an embodiment, the areal coverage of the driving transistor layers of the DS-VOLET 103 (i.e. 201a, 202a, 113a, 203a and 203b) could be smaller than, the same as, or larger than, the areal coverage of the light emitting layers 206. Additionally, light absorbing or reflecting layers may be added on the bottom of the substrate layer 126 or in between the gate electrode 201a and the substrate layer 126, or the substrate layer itself may be non-transparent, or the gate electrode 201a itself may include a non-transparent and/or reflecting material such as a metal for the purpose of shielding the driving transistor layers of the DS-VOLET 103 (i.e. 201a, 202a, 113a, 203a and 203b) from light.

Along with the depiction of the DS-VOLET 103 described herein, where positive charge is injected from the source layer 113a and controlled by the gate electrode 201a and electrons are injected from the drain layer 119 and the electrons and holes recombine in the light emitting layer 206b (e.g., the EL layer) to emit light, inverted versions of this arrangement may be implemented without significantly deviating from the spirit of this disclosure. In the case of an inverted AMDS-VOLET pixel 100, one embodiment may include a source layer 113 that injects electrons into the organic semiconducting layers 203, where the injection of these electrons may be controlled by the voltage applied to the gate electrode 201a. Likewise, holes may be injected by the drain layer 119. These holes may then recombine with the injected electrons in the light emitting layer 206b to emit light. Additional variations include top emitting inverted designs, completely transparent non-inverted and completely transparent inverted designs.

Turning now to a discussion of the Sw-T 106a in the embodiments of an active cell 102 illustrated in FIGS. 1B, 1C, 9A and 9B, the Sw-T 106a is a thin film transistor (TFT). The gate layer 109b included in the Sw-T 106a includes the Sw-T gate electrode 201b and the Sw-T gate dielectric 202b. The Sw-T gate electrode 201b is in direct contact with the substrate 126, and the Sw-T gate electrode 201b is in electrical contact with the scan conducting line 123c. The Sw-T gate dielectric 202b covers the surface of the Sw-T gate electrode 201b, as shown in the cross-sectional view in FIGS. 1B, 1C, 9A and 9B. The Sw-T gate dielectric 202b may be transparent or nontransparent and may include a bi-layer of an inorganic material, such as aluminum oxide, and a self assembled monolayer (SAM), such as octadecylphosphonic acid (ODPA). The inorganic material provides a large capacitance, and the SAM serves as a hydrophobizing layer. The Sw-T 106a further includes a semiconducting layer 216 that is positioned on the Sw-T gate dielectric 202b. The semiconducting layer 216 may include an organic or inorganic semiconducting material (e.g., pentacene or amorphous Si, respectively) that is transparent or nontransparent.

Figure 13:
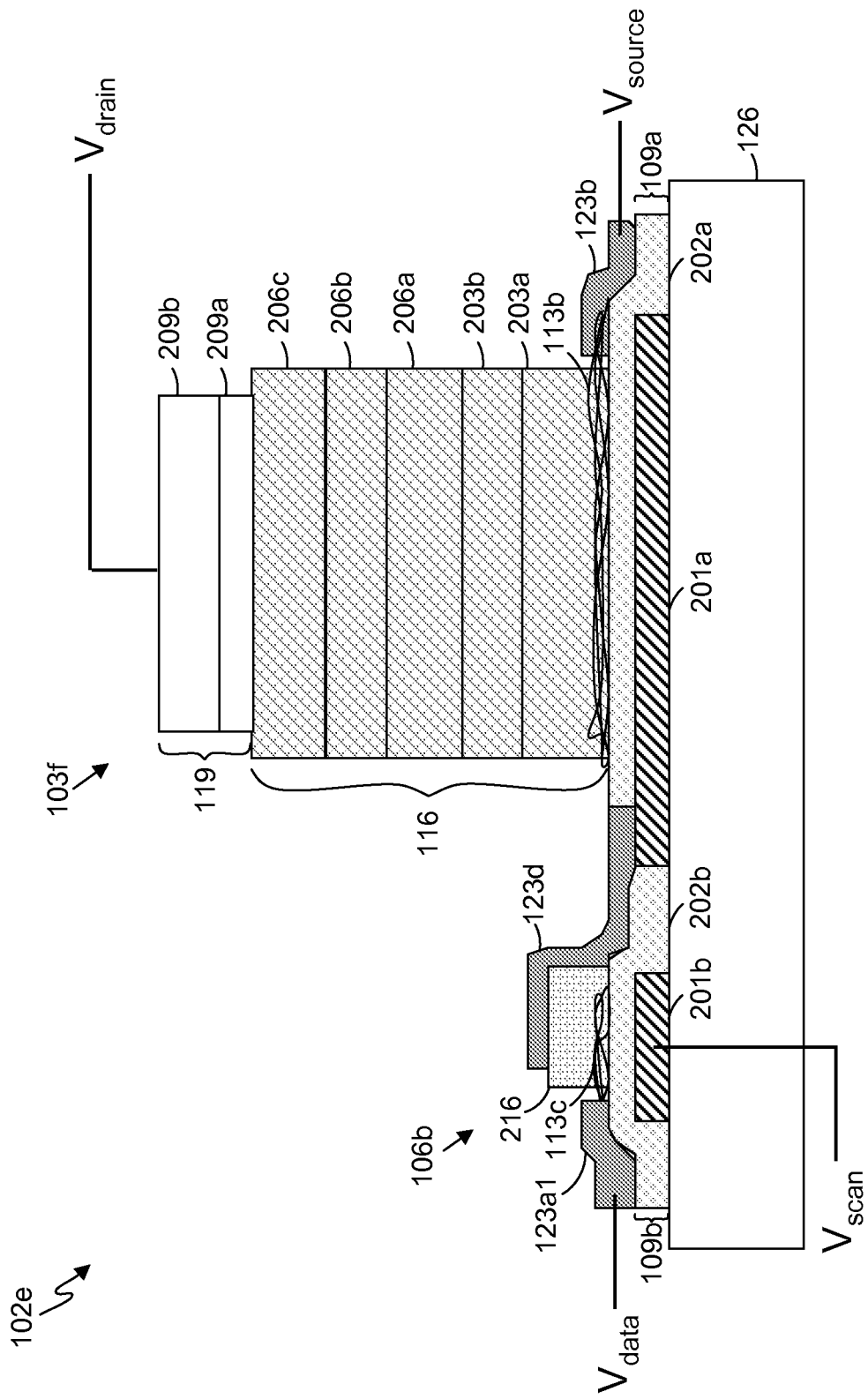
FIGS. 13, 18, 20, and 23 are cross-sectional views of examples of active cells of FIG. 1A including Sw-Ts of FIGS. 12, 17, 19, and 22 in accordance with various embodiments of the present disclosure.
Figure 18:
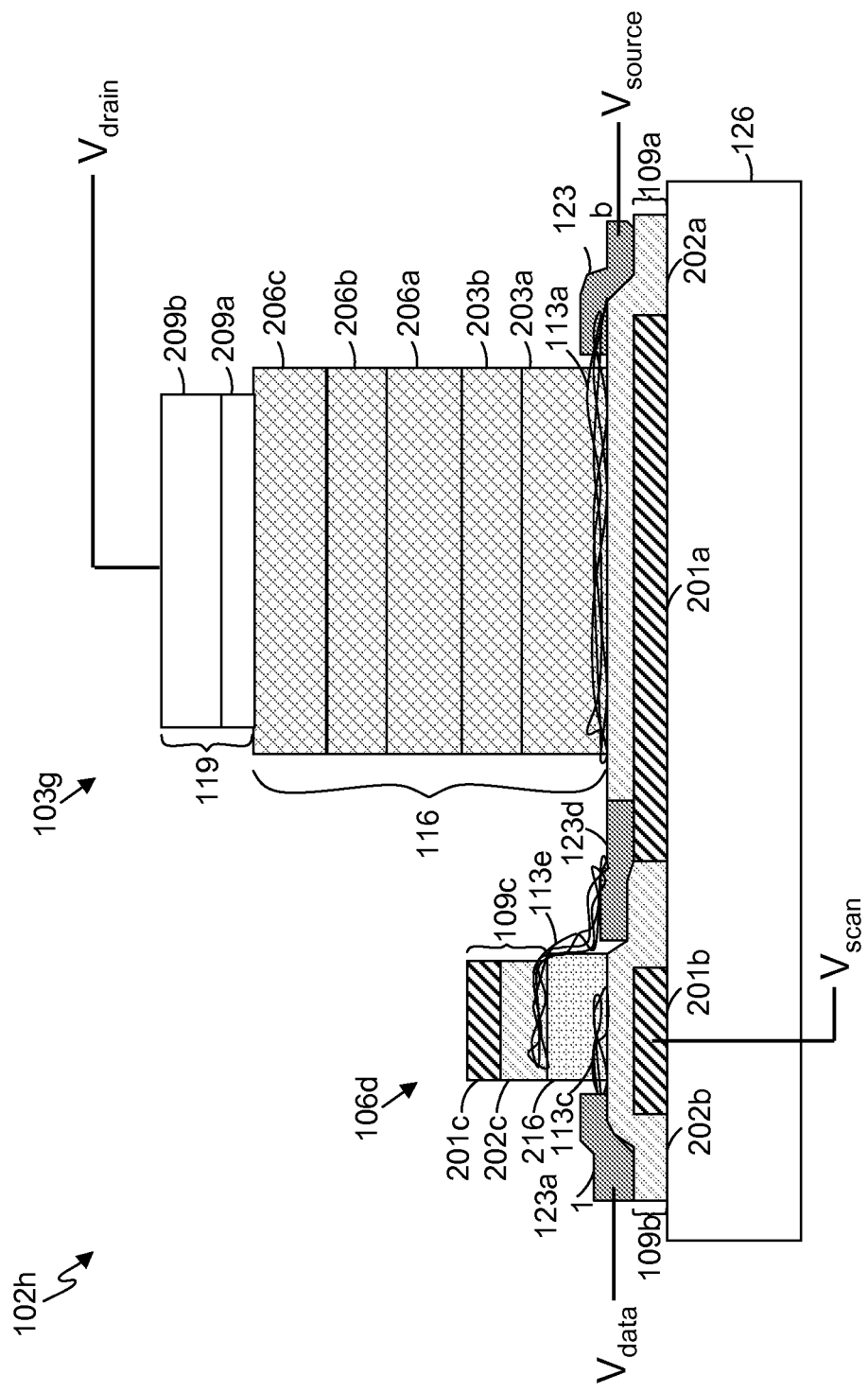

In the cross-sectional views of various embodiments of the active cell 102 illustrated in FIGS. 6, 13, and 18, only a CN-VOLET 103c, 103f, and 103g (respectively) embodiment is shown. However, as would be understood by a person of skill in the art, a DS-VOLET 103 may be used instead of the CN-VOLET 103c, 103f, and 103g in the various embodiments of the active cell 102 illustrated in FIGS. 6, 13, and 18.

Figure 10:
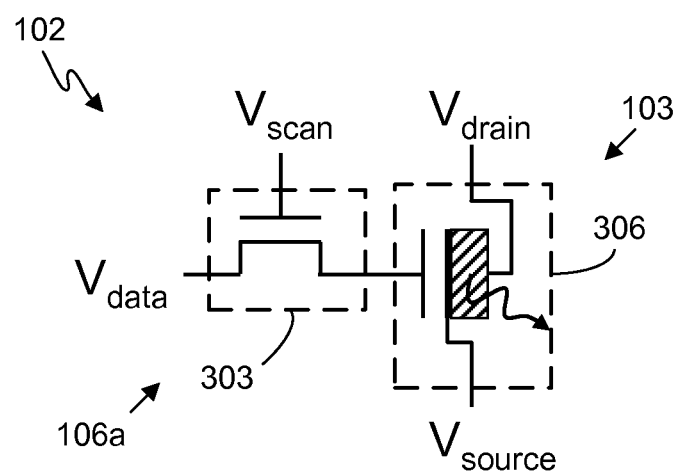
FIG. 10 is a circuit diagram illustrating an active cell of FIGS. 1B, 1C, 9A, and 9B in accordance with various embodiments of the present disclosure.

FIG. 10 is a circuit diagram illustrating the active cell 102a shown in the cross-sectional views in FIGS. 1B, 1C, 9A, and 9B. The Sw-T 106a includes a thin film transistor, which is represented by a transistor circuit element 303, and the DS-VOLET 103 is represented by a DS-VOLET circuit element 306. As shown in the diagram, the $V_{scan}$ signal is coupled to the gate of the transistor circuit element 303. Further, the $V_{data}$ signal is coupled to the source/drain of the transistor circuit element 303, and the drain/source of the transistor circuit element 303 is coupled to the gate of the DS-VOLET 103.

Figure 11:
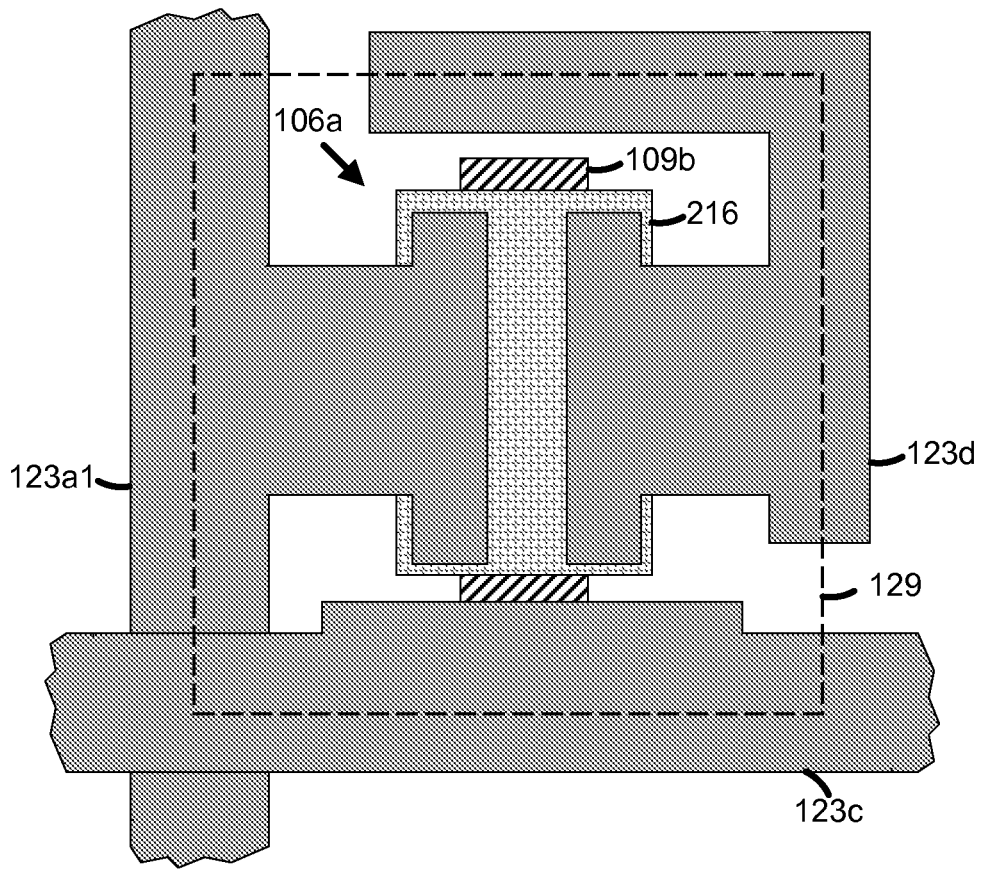
FIGS. 11, 12, 15, 17, 19, and 22 are plan views of examples of layouts of switching transistors (Sw-Ts) of FIG. 1A in accordance with various embodiments of the present disclosure.

FIG. 11 is a plan view showing an example layout of the Sw-T 106a shown in FIGS. 1B, 1C, 9A, 9B, and 3. The layout shown in FIG. 11 corresponds to the Sw-T region 129 defined by dashed lines in FIG. 1A. The Sw-T 106a illustrated in FIG. 11 includes the gate layer 109b (including the Sw-T gate electrode 201b and the Sw-T gate dielectric 202b shown in FIGS. 1B, 1C, 9A, and 9B), and the Sw-T 106a further includes the semiconducting layer 216 positioned on the gate layer 109b. The conducting line 123d is coupled to the semiconducting layer 216, and although not illustrated in FIG. 11, the conducting line 123d is coupled to the DS-VOLET gate electrode 201a of the DS-VOLET 103. The scan conducting line 123c is coupled to the gate layer 109b, and the data conducting line 123a is coupled to the opposite end of the semiconducting layer 216 from the end of the semiconducting layer 216 coupled to the conducting line 123d.

Next, Sw-T designs are described including single and multiple DS-VFETs connected in various ways in place of the TFT of the embodiment described in the Sw-T 106a. These versions including DS-VFETs take advantage of the DS-VFET and DS-VOLET design over the traditional TFT design. In short, the short channel length and large areal current capacity of the DS-VFET architecture enable the Sw-T to be made smaller for the same current output capacity and therefore occupy a smaller area than one made from a Sw-T comprising a TFT. This allows the aperture ratio of the AMDS-VOLET pixel 100 to increase further.

Figure 12:
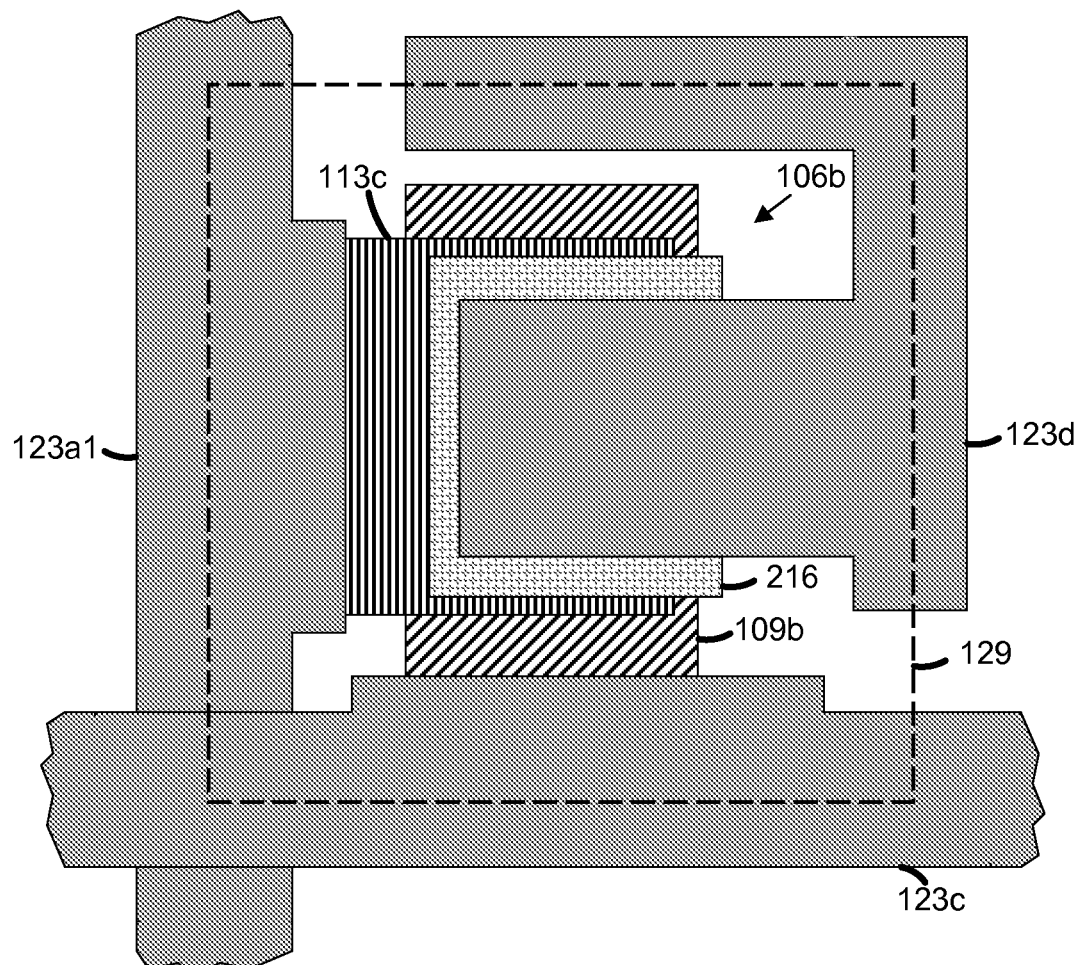

FIG. 12 is a plan view showing an example layout of an embodiment of a Sw-T 106, denoted herein as 106b, and FIG. 13 is a cross-sectional view of an embodiment of an active cell 102e comprising the Sw-T 106b. The layout shown in FIG. 12 corresponds to the Sw-T region 129 defined by dashed lines in FIG. 1A. The Sw-T 106b includes a single carbon nanotube-enabled vertical field effect transistor (CN-VFET), which could also be replaced by a DS-VFET. Various embodiments of the CN-VOLET 103b, and other embodiments of the DS-VFET and DS-VOLET 103, are described in U.S. Patent Application Publication US 2010/0237336, having Ser. No. 12/677,457, entitled "Nanotube Enabled, Gate-Voltage Controlled Light Emitting Diodes" and filed Sep. 10, 2008; International Publication WO 2011/109693 A2, having International Application No. PCT/US2011/027155, entitled "Semiconductor Devices Including an Electrically Percolating Source Layer and Methods of Fabricating the Same" and filed Mar. 4, 2011; and U.S. Provisional Application entitled "Semiconductor Devices Including a Nanotube Layer and a Memory Layer and Methods of Fabricating the Same" having Ser. No. 61/310,342 and being filed on Mar. 4, 2010, all of which are hereby incorporated by reference herein in their entirety. Unlike Sw-T 106a of FIG. 11, which includes a TFT, the Sw-T 106b of FIG. 12 is a CN-VFET that includes a source layer 113c having a dilute carbon nanotube layer. The source layers 113b and 113c (FIG. 13) may be deposited at the same time in the case including a CN-VOLET 103f. Likewise the source layers 113a (FIG. 1B) and 113c may be deposited at the same time in the case including a DS-VOLET 103. Also the Sw-T 106b in FIGS. 12 and 13 could consist of a DS-VFET in which the source layer 113c could include others source electrodes including any of the percolating dilute networks listed earlier for the DS-VOLET 103. The source layer 113c can include any low density of states metal, inorganic or organic; low density of states semiconductor, inorganic or organic; or low density of states semi-metal, inorganic or organic. An example of a low density of states organic semi-metal includes graphene. Graphene can be single layered or multi-layered and can be patterned to include perforations or un-patterned. Referring to FIG. 13, the structure of the CN-VOLET 103f is the same as the structure illustrated in the embodiment shown in FIG. 1C and could optionally be replaced by the structures shown in FIG. 1B, 9A, or 9B.

Similar to the Sw-T 106a illustrated in FIGS. 1B, 1C, 9A, and 9B, the Sw-T 106b illustrated in FIG. 13 includes a gate layer 109b that comprises a Sw-T gate electrode 201b and a Sw-T gate dielectric 202b. The Sw-T gate electrode 201b is coupled to scan conducting line 123c (FIG. 12). The Sw-T gate dielectric 202b covers the surface of the Sw-T gate electrode 201b. The Sw-T gate electrode 201b may be transparent or nontransparent and may include a bi-layer of an inorganic material such as aluminum oxide (e.g., $Al_2O_3$) and a polymer such as BCB. The inorganic material provides a large capacitance, and the polymer serves as a hydrophobizing layer.

Next, the Sw-T 106b includes a source layer 113c that is coupled to a data conducting line 123a. As mentioned above, the source layer 113c includes a dilute carbon nanotube layer. Positioned on the source layer 113c is the semiconducting layer 216. The semiconducting layer 216 includes a single layer or multiple layers, or doped single or multiple layers. These layers may include an organic semiconducting material, such as pentacene, or an inorganic semiconducting material, such as silicon (amorphous, nanocrystalline/microcrystalline or polycrystalline). Silicon can be deposited by PECVD. In some embodiments, possible p-dopants of a semiconducting layer 116 that is organic include $SbCl_5$, $WO_3$, molybdenum oxide, $ReO_3$, iron III chloride, iron oxide, F4-TCNQ, F2-HCNQ or F6-TNAP. In other embodiments where the semiconducting layer 116 includes silicon, possible dopants include boron (p-type) and phosphorous or arsenic (both n-type).

Figure 14A:
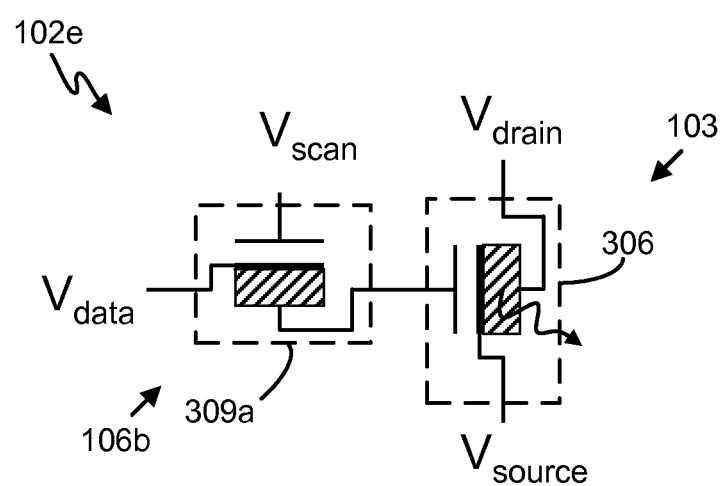
FIGS. 14A, 14B, 16, 21, and 24 are circuit diagram illustrating examples of active cells of FIGS. 13, 15, 20, and 23 in accordance with various embodiments of the present disclosure.
Figure 14B:
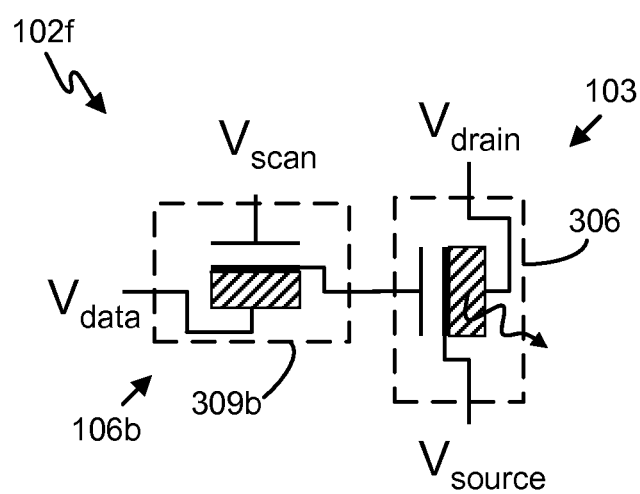

FIG. 14A is a circuit diagram illustrating an example of the active cell 102e illustrated in FIG. 13. As shown in FIG. 13, the conducting line 123d is positioned on the semiconductor layer 216 in the Sw-T 106b to form a drain electrode coupled to a DS-VOLET 103 or to a CN-VOLET 103f. As discussed above, the Sw-T 106b includes a CN-VFET, which is represented by a CN-VFET or DS-VFET circuit element 309a in FIG. 14A. FIG. 14B is a circuit diagram illustrating another example of an active cell 102, denoted herein as 102f. Similar to the active cell 102e illustrated in FIG. 14A, the active cell 102f includes a DS-VOLET 103. The active cell 102f also includes a Sw-T 106b. Further, the Sw-T 106b includes a CN-VFET, which is represented by a CN-VFET or DS-VFET circuit element 309b in FIG. 14B. However, in the CN-VFET circuit element 309b, the source-drain connections of the Sw-T 106b are reversed. The source electrode (i.e., the source layer 113c) of the Sw-T 106b (instead of the drain electrode of the Sw-T 106b) is coupled to the conducting line 123d allowing electrical connection to the gate electrode 201a of the CN-VOLET 103. Accordingly, in the active cell 102f, the drain electrode is formed by the data conducting line 123a1.

Figure 15:
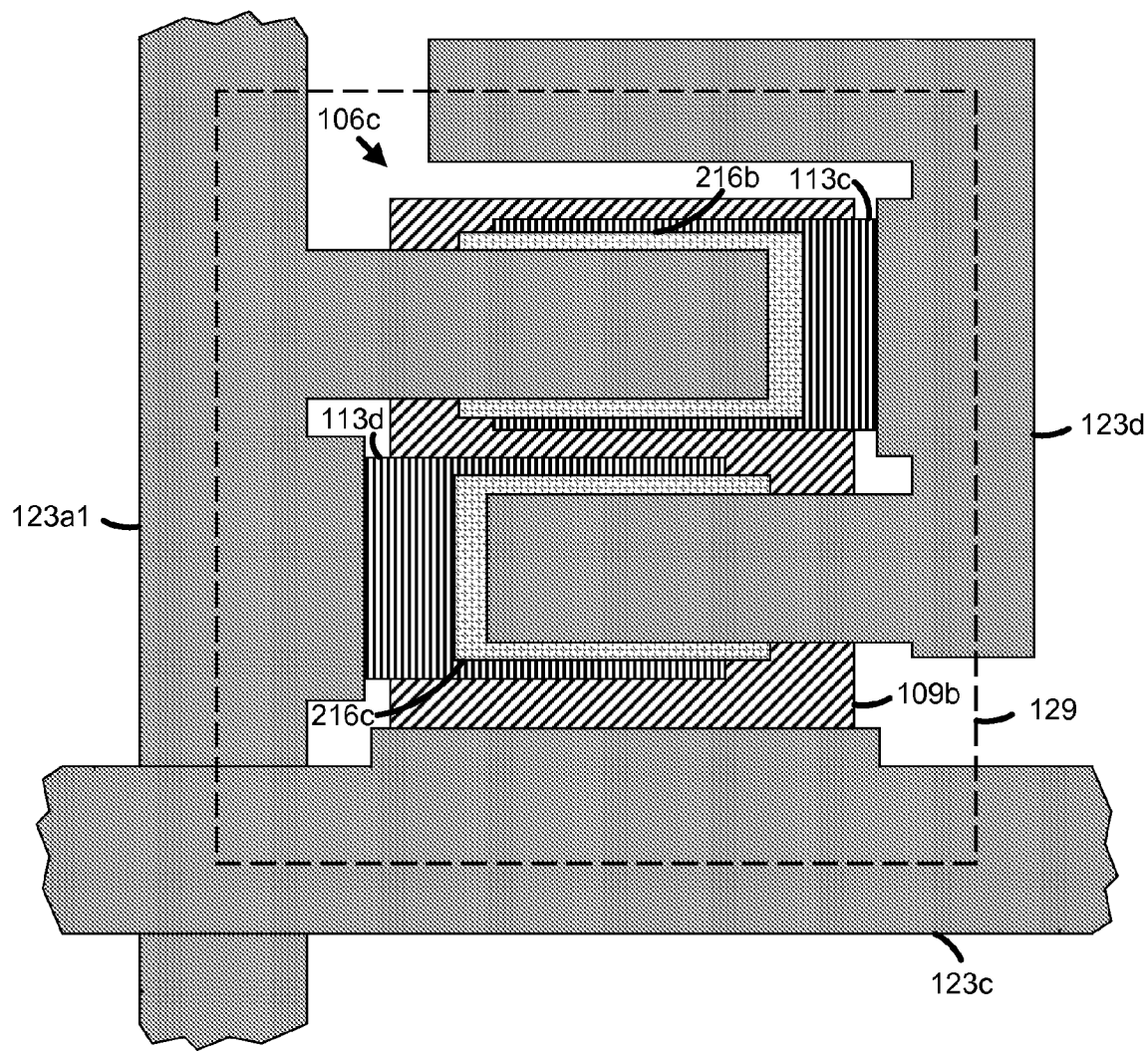
Figure 16:
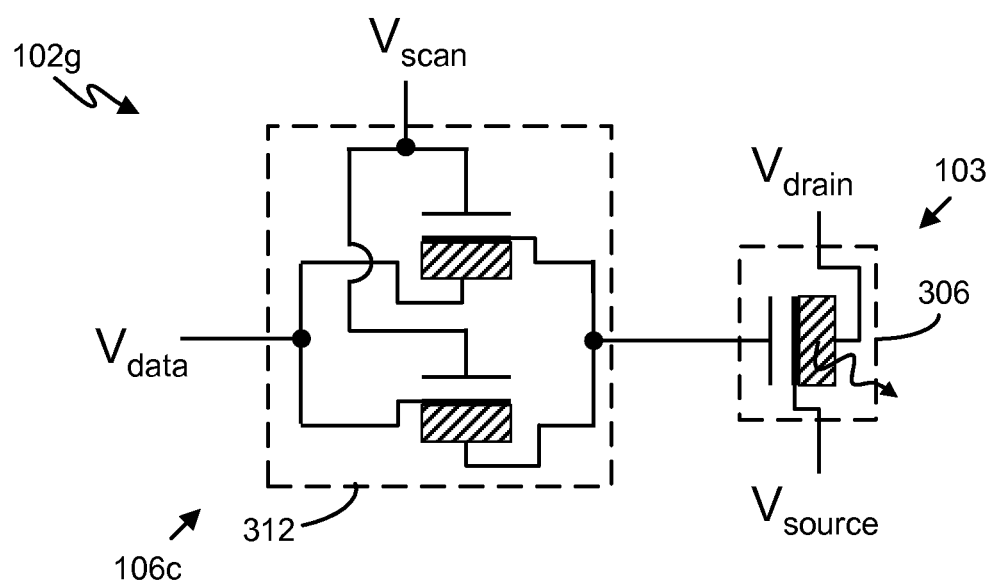

FIG. 15 is a plan view showing an example layout of an embodiment of a Sw-T 106, denoted herein as 106c, and FIG. 16 is a circuit diagram including an embodiment of an active cell 102g comprising the Sw-T 106c illustrated in the plan view shown in FIG. 15. The layout shown in FIG. 15 corresponds to the Sw-T region 129 defined by dashed lines in FIG. 1A. Referring to FIGS. 15 and 16, the Sw-T 106c shown includes a double lateral CN-VFET or a double lateral DS-VFET. In FIG. 16, the double lateral CN-VFET or double lateral DS-VFET included in the Sw-T 106c is represented by a double lateral CN-VFET or double lateral DS-VFET circuit element 312. A double lateral CN-VFET includes two CN-VFETs coupled in parallel and positioned side-by-side with reversed source layers 113c, 113d and drain electrodes, and the two CN-VFETs share a common gate layer 109b. Likewise, a double lateral DS-VFET includes two DS-VFETs coupled in parallel and positioned side-by-side with reversed source layers 113c, 113d and drain electrodes, and the two DS-VFETs share a common gate layer 109b.

The Sw-T 106c (i.e., including a double lateral CN-VFET or double lateral DS-VFET) enables better current control than the Sw-T 106b over supplying and removing charge to and from the DS-VOLET gate electrode 201a from the data conducting line 123a. In contrast, when the Sw-T 106b (i.e., including the single CN-VFET or DS-VFET) of FIGS. 12, 13, 14A, and 14B is forward biased, the current travels from the source layer 113c to the conducting line 123d (i.e., from source to drain), and the current is sufficiently controlled to add an adequate amount of charge to operate the DS-VOLET 103 at a specified gray scale. However, when the Sw-T 106b is reverse biased, the current traveling from the conducting line 123d to the source layer 113c (i.e., from drain to source) is not sufficiently controlled, resulting in a loss of the charge stored on the DS-VOLET gate electrode 201a in the time between refresh events of the active cell 102. A refresh event includes an addressing of the active cell 102 by pulsing the voltage of the scan conducting line 123c of a specified row, thereby charging the DS-VOLET gate electrode 201a of the DS-VOLET 103 with a charge from the data conducting line 123a of a specified column. Controlling the traveling of the charge equally well to and from the gate of the DS-VOLET 103 provides for successful operation of the AMDS-VOLET pixel 100.

The gate layer 109b, source layers 113c, 113d, semiconductor layers 216b, 216c of the double lateral CN-VFET or double lateral DS-VFET included in the Sw-T 106c may be made using the same fabrication processes as the Sw-T 106b mentioned above, except that the layers of the Sw-T 106c are patterned as illustrated in the example layout shown in FIG. 15. Additionally, the source layers 113c, 113d may be deposited at the same time as part of the same patterned layer. Likewise, the semiconductor layers 216b, 216c may also be deposited at the same time as part of the same patterned layer. The arrangement of these layers is shown in the example illustrated in FIG. 15. In some embodiments of the Sw-T 106c, the conducting line 123d, forming the drain electrode of the lower single CN-VFET or DS-VFET in FIG. 15, and the conducting line 123a, forming the drain electrode of the upper single CN-VFET or DS-VFET in FIG. 15, may include a material that forms a Schottky barrier >0.1 eV for electrons or holes when in contact with the semiconductor layers 216b, 216c of the double lateral CN-VFET or double lateral DS-VFET.

Figure 17:
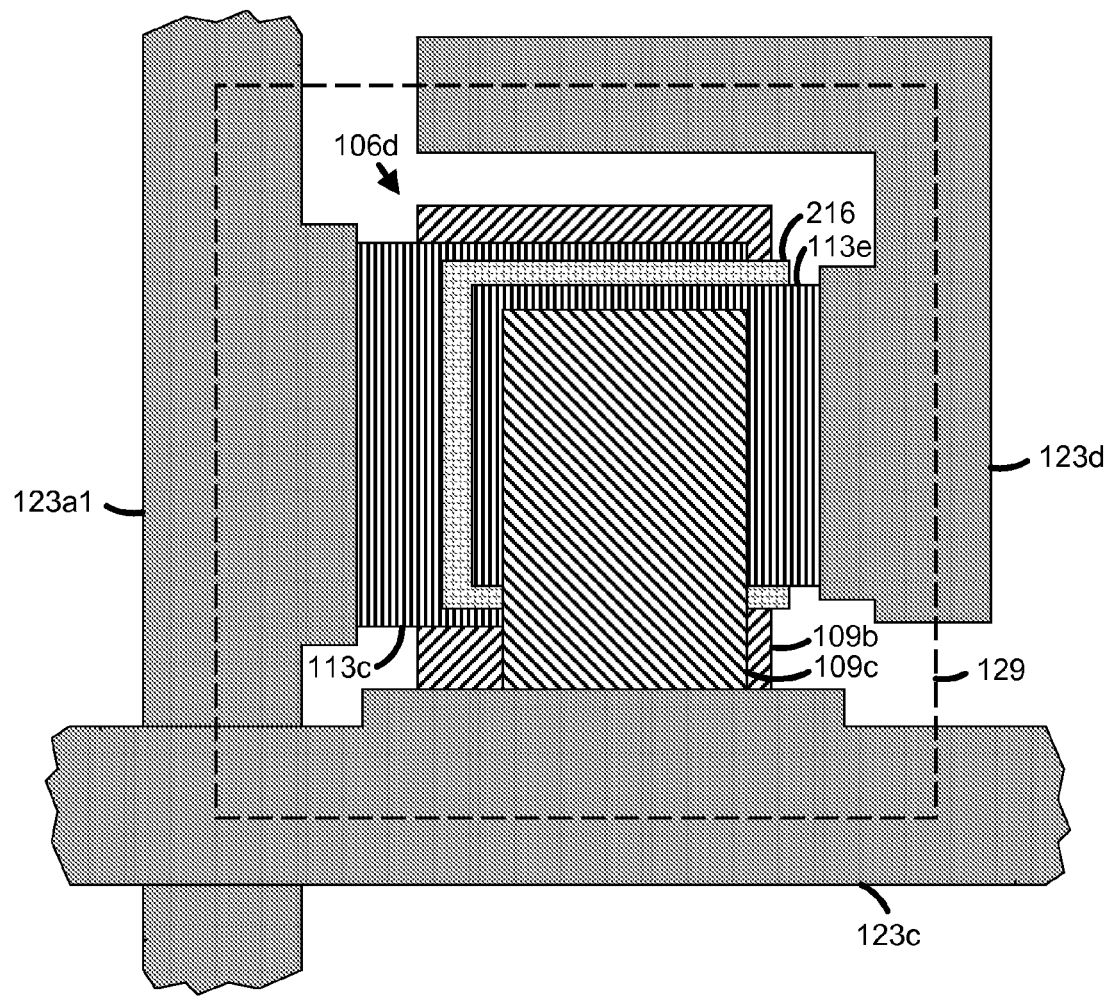

FIG. 17 is a plan view showing an example layout of another embodiment of a Sw-T 106, denoted herein as 106d, and FIG. 18 is a cross-sectional view of an embodiment of an active cell 102h comprising the Sw-T 106d. The layout shown in FIG. 17 corresponds to the Sw-T region 129 defined by dashed lines in FIG. 1A. In this embodiment, the Sw-T 106d comprises a double inverted CN-VFET or double inverted DS-VFET. Pictured in FIG. 18 is an embodiment of the Sw-T 106d comprising a double inverted CN-VFET. The double inverted CN-VFET and double inverted DS-VFET have a design similar to a single CN-VFET and DS-VFET, respectively, with at least one difference being the addition of another source layer 113e that functions as a drain layer. The source layer 113e includes a dilute carbon nanotube network in the case when the Sw-T 106d comprises a double inverted CN-VFET, and the source layer 113e is coupled to the conducting line 123d. A gate layer 109c is positioned on the source layer 113e including a Sw-T gate dielectric 202c and a Sw-T gate electrode 201c, as shown in FIGS. 17 and 18.

The gate layer 109b, the source layer 113c, the semiconductor layer 216 of the double inverted CN-VFET or double inverted DS-VFET may be made in the same manner and from the same materials as the Sw-T 106b mentioned above, except that the layers of the Sw-T 106d are patterned as illustrated in the example layout shown in FIG. 17. The coverage of the layers is shown in the examples illustrated in FIGS. 17 and 18. For example, the source layer 113e is deposited on the semiconductor layer 216, and a second gate layer 109c is deposited on the source layer 113e. As shown in FIG. 18, the second gate layer 109c includes a Sw-T gate dielectric 202c deposited on the source layer 113e and a Sw-T gate electrode 201c deposited on the Sw-T gate dielectric 202c. The Sw-T gate dielectric 202c may be a single insulating layer or multiple insulating layers. The Sw-T gate electrode 201c may be a metal (e.g., aluminum (Al)), a TCO (e.g., ITO), and/or a mixture of the two or other conducting materials including carbon nanotubes, graphene, PEDOT:PSS and conductive nanoparticles. The embodiment of a Sw-T 106d illustrated in FIGS. 17 and 18, while different from the Sw-T 106c (i.e., including a double lateral CN-VFET and double lateral DS-VFET), affords similar current control benefits over the Sw-T 106b (i.e., including a single CN-VFET and single DS-VFET).

Figure 19:
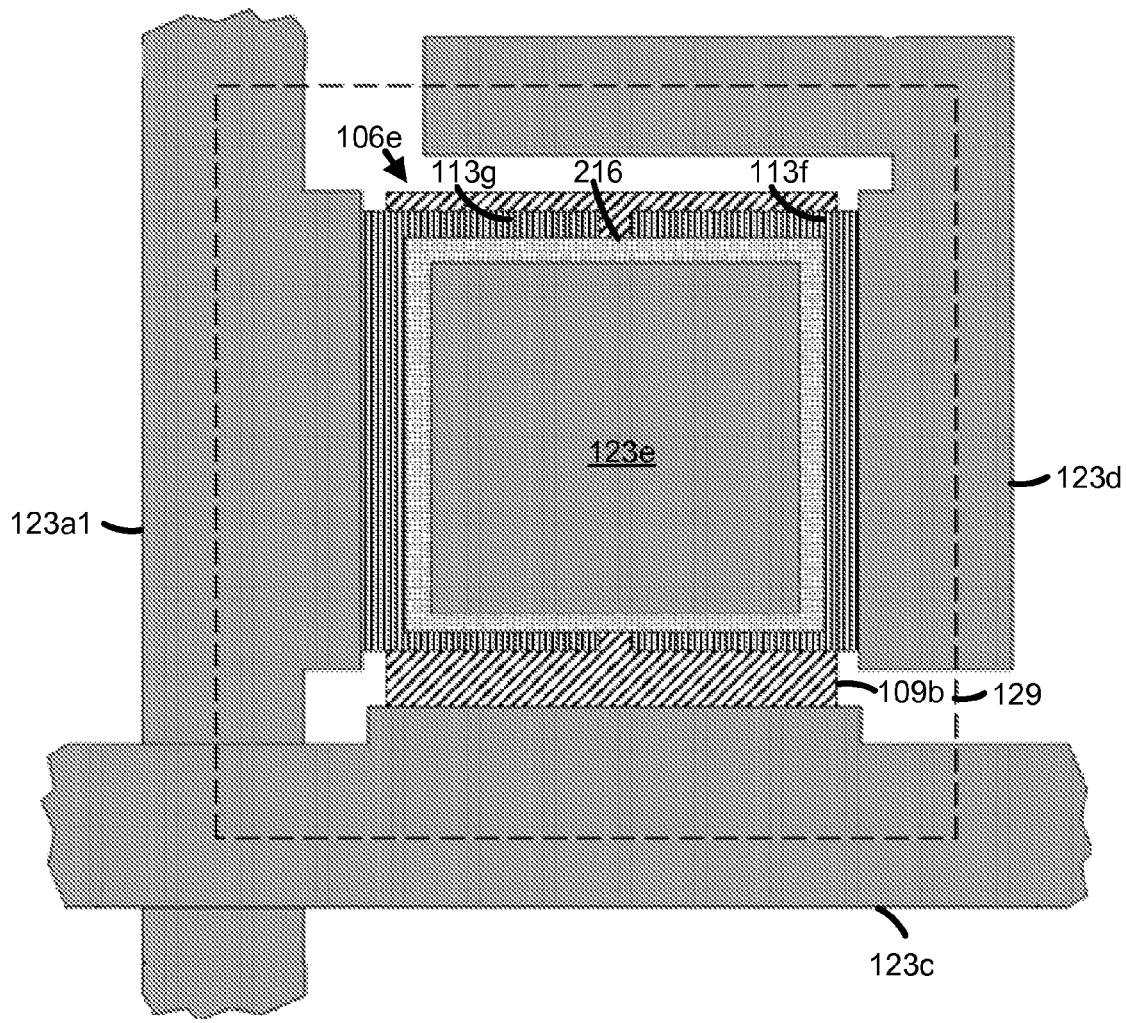
Figure 20:
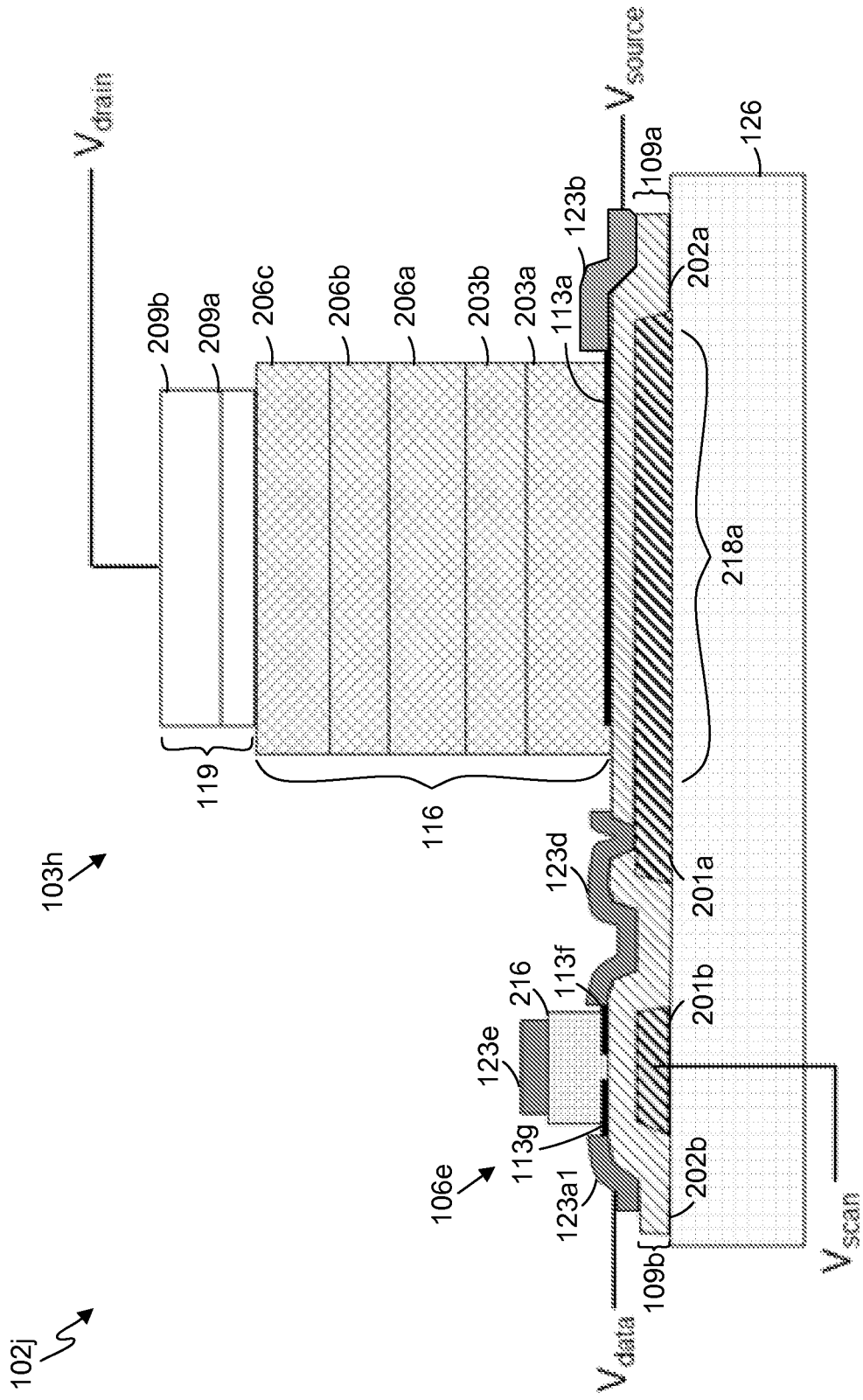
Figure 21:
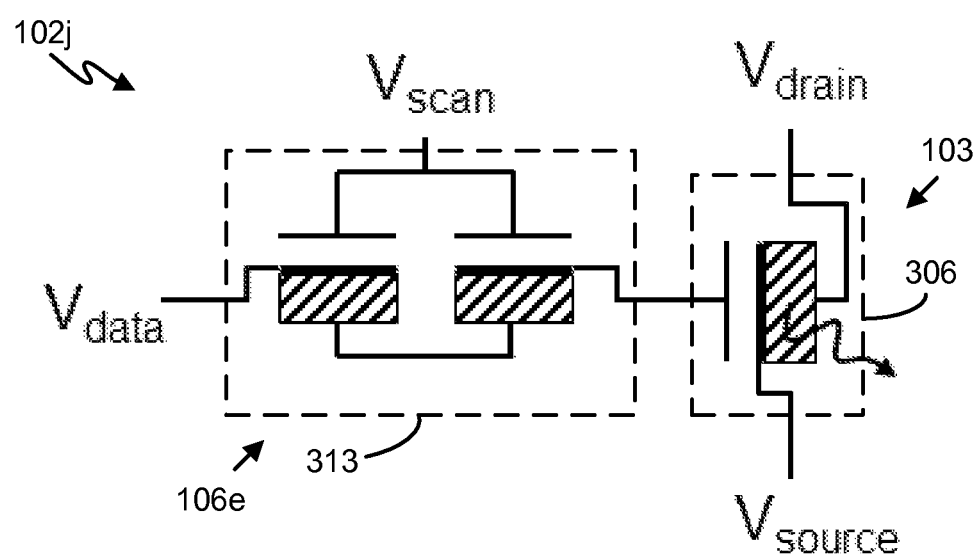

FIG. 19 is a plan view showing an example layout of another embodiment of a Sw-T 106, denoted herein as 106e, and FIG. 20 is a cross-sectional view of an embodiment of an active cell 102j comprising the Sw-T 106e. The layout shown in FIG. 19 corresponds to the Sw-T region 129 defined by dashed lines in FIG. 1A. In this embodiment, the Sw-T 106e comprises a reversed series double CN-VFET or reversed series double DS-VFET. Pictured in FIGS. 19 and 20 is the embodiment of the Sw-T 106e comprising a reversed series double DS-VFET. The reversed series double DS-VFET has a design similar to a single DS-VFET, with at least one difference being the addition of another source layer 113f that functions as the source layer of a second series connected, but reversed in polarity, DS-VFET. The source layer 113f includes all the previously mentioned materials for the DS-VFET or DS-VOLET including a dilute nanotube network. The source layer 113f is coupled to the conducting line 123d. The drain electrode 123e of the Sw-T 106e is shared between both DS-VFETs as shown in FIGS. 19 and 20. FIG. 21 shows a circuit diagram for the active cell 102j including a reversed series double DS-VFET Sw-T 106e which is denoted as circuit element 313.

The gate layer 109b, the source layers 113f and 113g, the semiconductor layer 216 of the reversed series double DS-VFET may be made in the same manner and from the same materials as the Sw-T 106b mentioned above, except that the layers of the Sw-T 106e are patterned as illustrated in the example layout shown in FIGS. 19 and 20. In some embodiments of the Sw-T 106e, the drain electrode 123e may include a material that forms an ohmic contact barrier <0.2 eV for electrons or holes when in contact with the semiconductor layer 216b of the reversed series double DS-VFET. The embodiment of the Sw-T 106e illustrated in FIGS. 19 and 20, while different from the Sw-T 106c (i.e., including a double lateral CN-VFET and double lateral DS-VFET), affords similar current control benefits over the Sw-T 106b (i.e., including a single CN-VFET and single DS-VFET).

Figure 22:
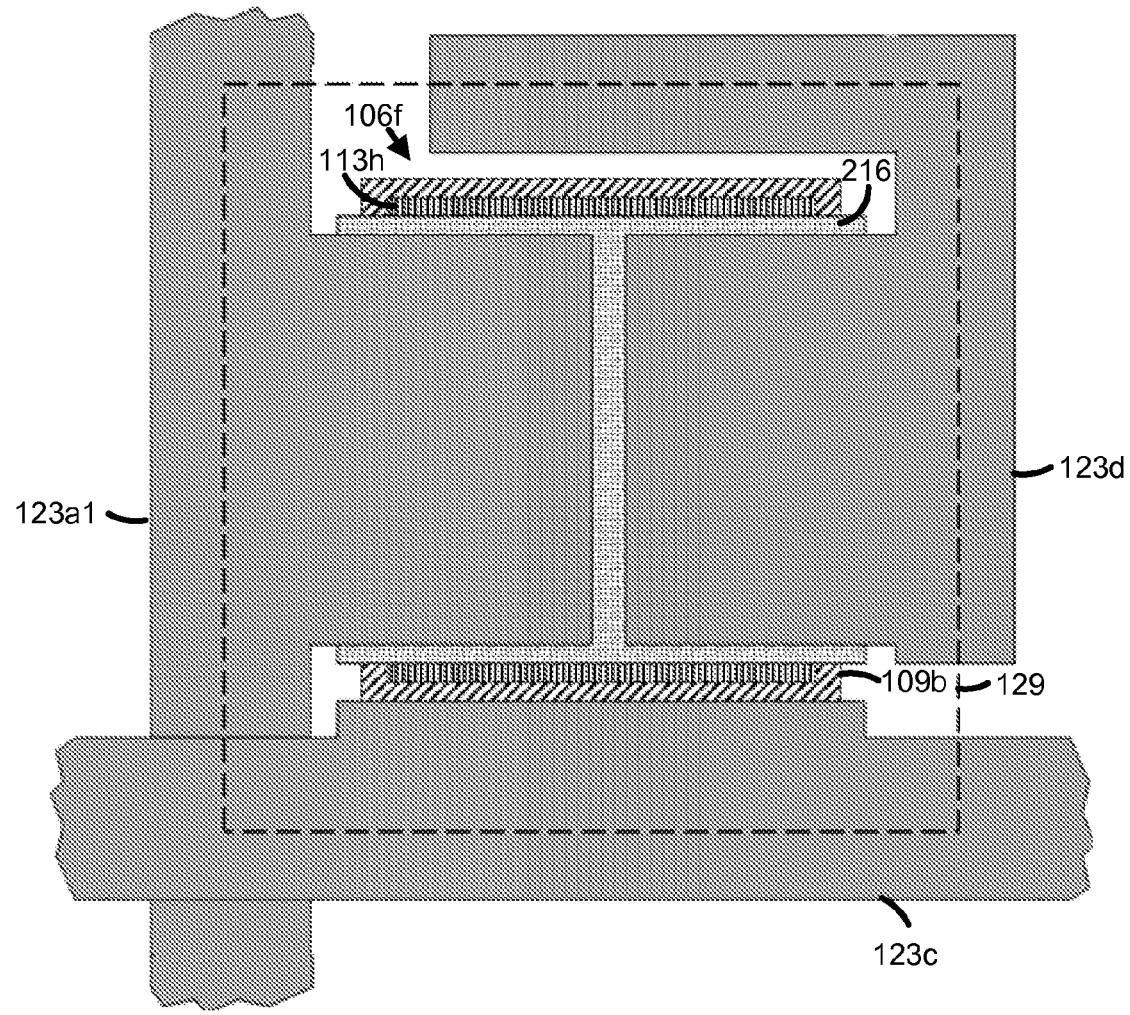
Figure 23:
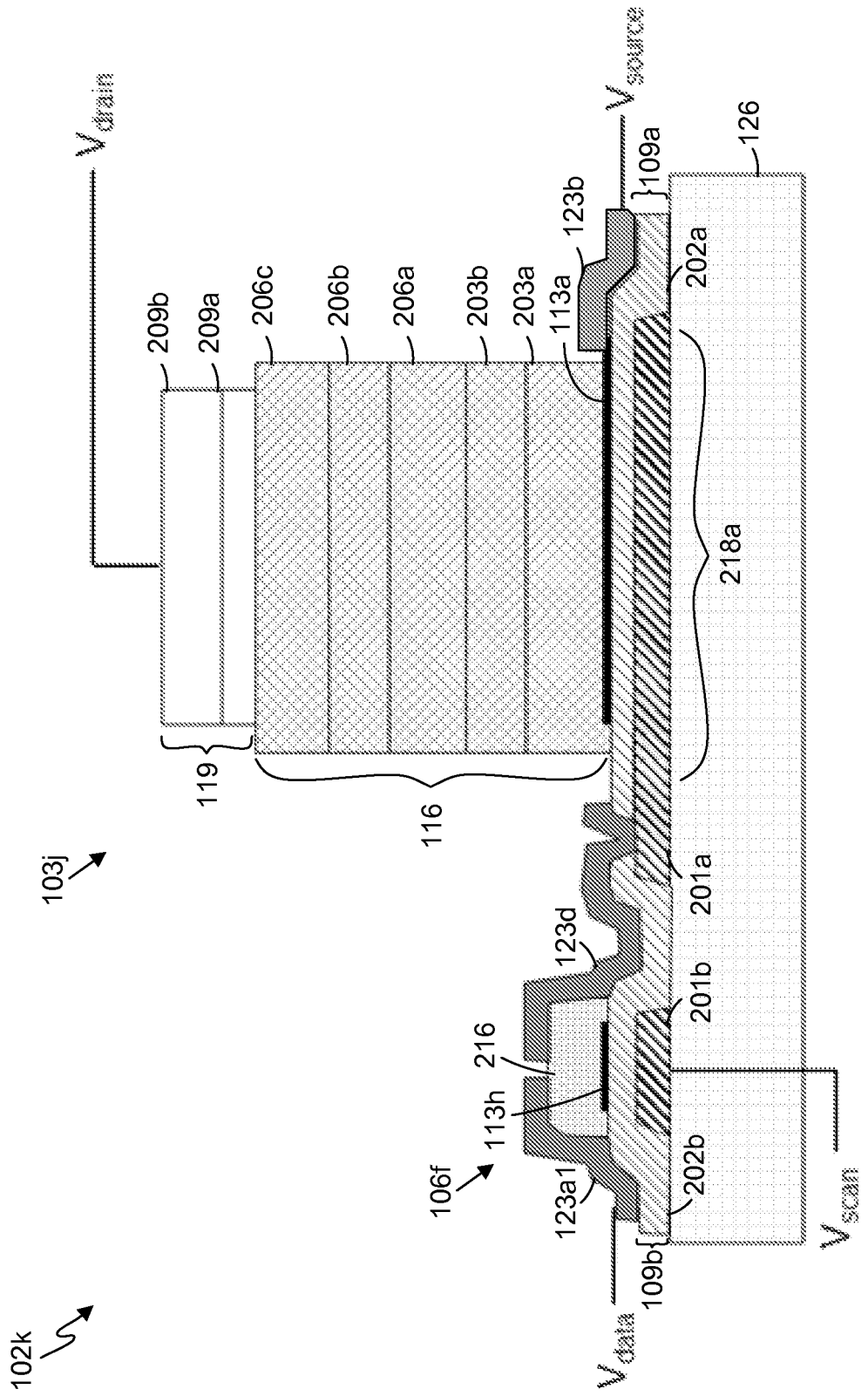
Figure 24:
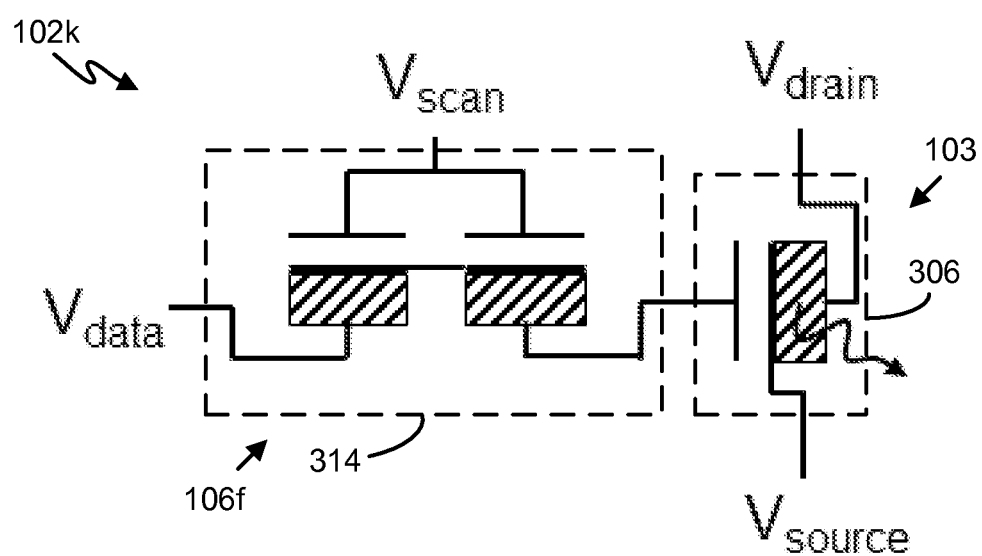

Another embodiment of a Sw-T 106 includes reversing the polarity of each DS-VFET in the reversed series double DS-VFET embodiment and is shown in FIGS. 22, 23 and 24 and is denoted herein as Sw-T 106f. FIG. 23 is a cross-sectional view of an embodiment of an active cell 102k comprising the Sw-T 106f. The DS-VFETs in the Sw-T 106f share a common source electrode 113h with separately patterned drain electrodes as shown in FIGS. 22 and 23. FIG. 24 shows a circuit diagram for the reversed series double DS-VFET Sw-T 106f with its circuit element denoted as 314.

Figure 25:
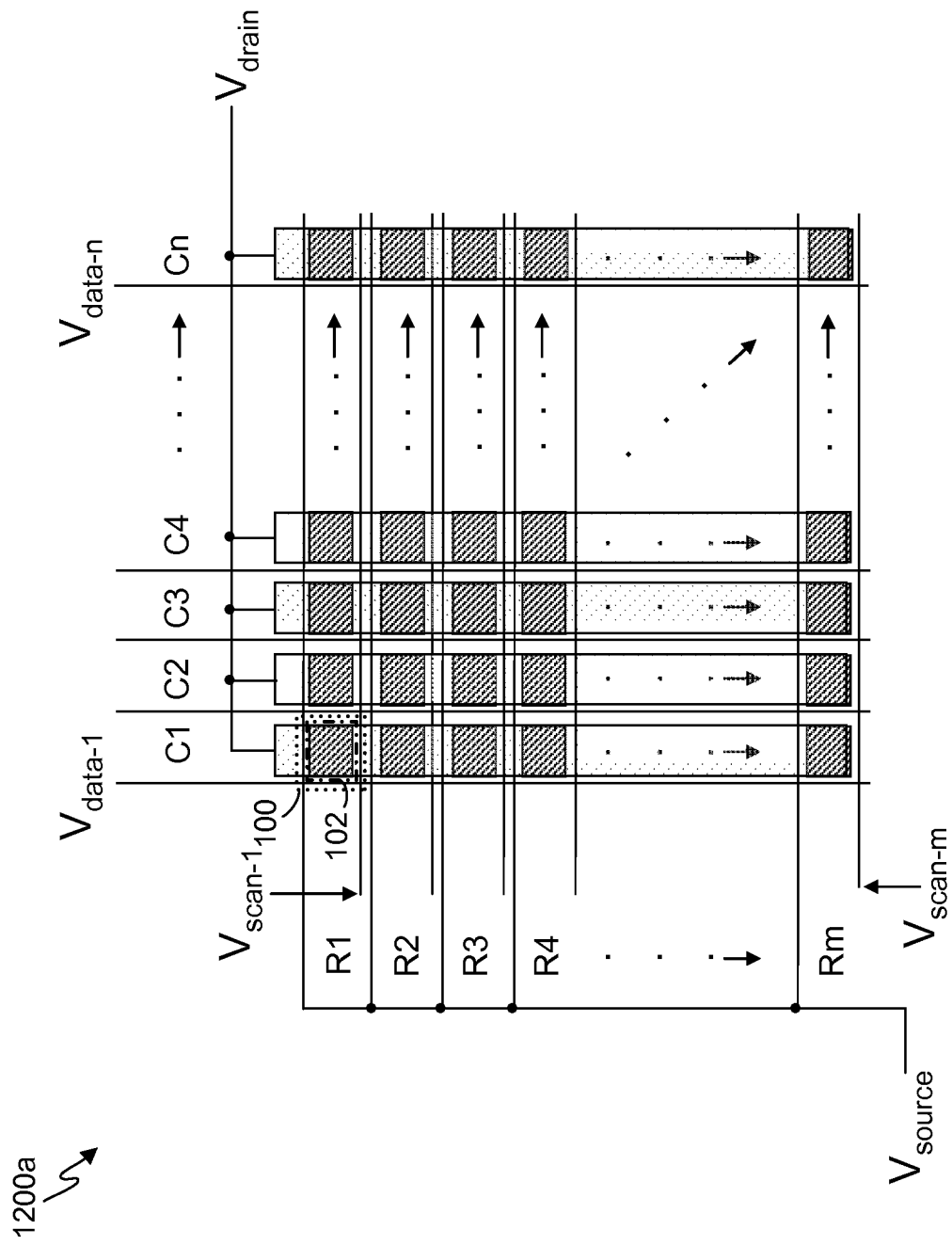
FIGS. 25 and 26 are plan views showing examples of layouts of an array of AMDS-VOLET pixels of FIG. 1A in accordance with various embodiments of the present disclosure.

FIG. 25 is a plan view showing an example layout of embodiment of an array 1200 of AMDS-VOLET pixels 100, denoted herein as 1200a. Each AMDS-VOLET pixel 100 each emits light of the same color, and each AMDS-VOLET pixel 100 includes an active cell 102 according to any of the embodiments described above. The active cells 102 are laid out in an array 1200a of n columns by m rows, with the location of each active cell 102 designated by coordinates (n,m), where n is the column number and m is the row number. Each active cell 102 is addressable by the $V_{scan-n}$ and $V_{data-m}$ signals which are provided by external control circuitry, which may be mounted to a display panel in its periphery. The $V_{drain-m}$ voltage signals may all be connected to a single voltage supply providing a specified voltage. The $V_{source}$ voltage signals may all be connected to a single voltage supply providing a specified voltage.

Figure 26:
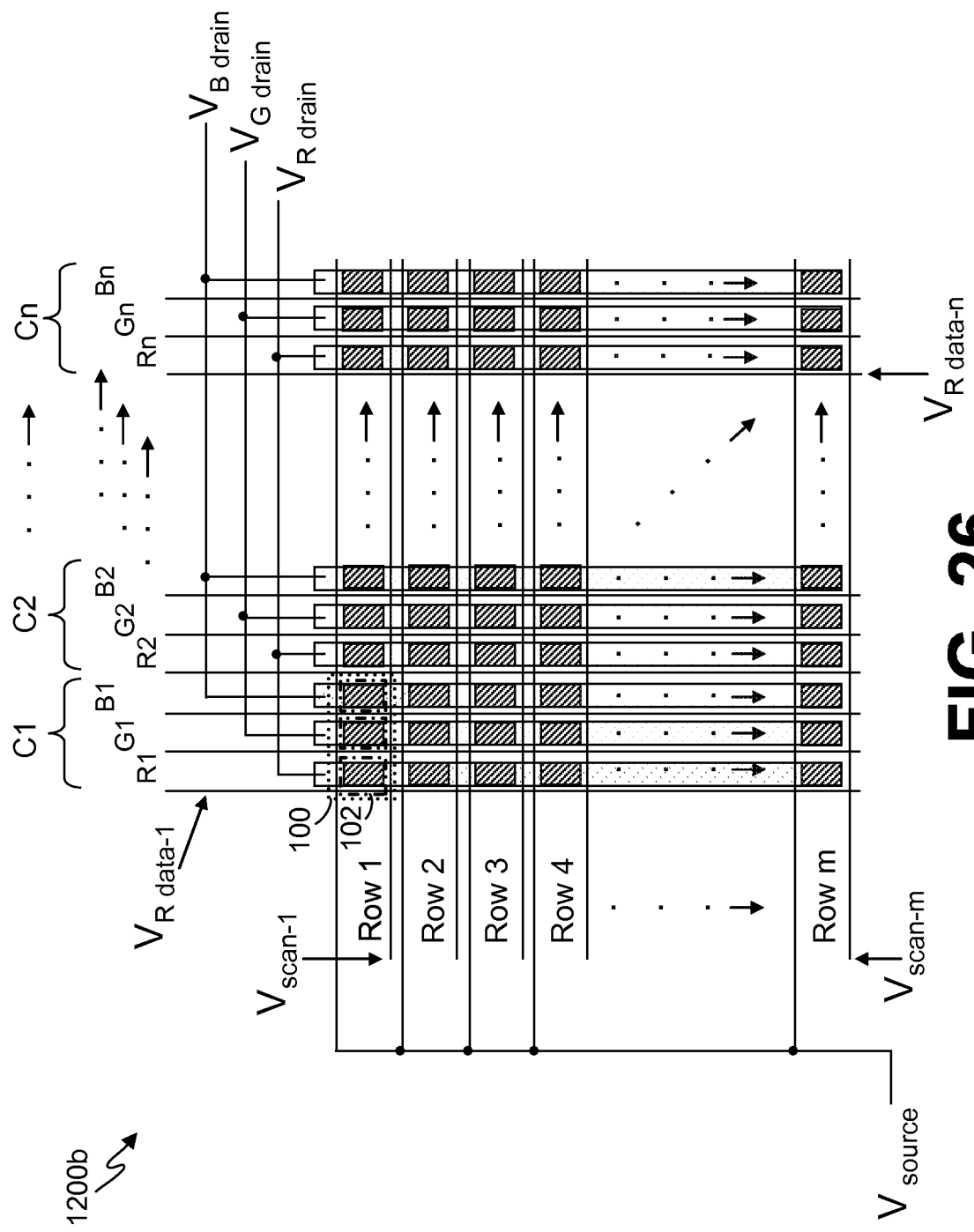

FIG. 26 is a plan view showing an example layout of another embodiment of an array 1200 of AMDS-VOLET pixels 100, denoted herein as 1200b. Each AMDS-VOLET pixel 100 includes three active cells 102, each emitting a different color (e.g., red, blue, green), according to any of the embodiments described above. In one embodiment, the AMDS-VOLET pixel 100 includes three active cells 102 side-by-side, where one active cell 102 is red (R), one green (G), and the other blue (B). Repeated active cells 102 are laid out in a matrix of n columns by m rows, with the location of each repeated cell designated by coordinates, (n,m), where n is the column number and m is the row number. Each column Cn is divided into three colors as shown in FIG. 26. Column Cn is divided into individual columns according to the column color (e.g., Rn (red), Gn (green) and Bn (blue)).

The various colors of the active cells 102 may be achieved according to various color attainment methods. In a first color attainment method, the color is determined by the choice of material used in the light emitting layer 206*b* (i.e., the EL layer) of the DS-VOLET 103 in the respective active cell 102. In other words, the material included in the light emitting layer 206*b* emits the desired color, either R, G, or B. In a second color attainment method, the material included in the light emitting layer 206*b* is chosen to emit white light and an appropriate color filter layer is employed to allow the specified R, G or B color to transmit through the color filter layer. The color filter layer may be placed on the opposite side of the substrate layer 126 or between the substrate layer 126 and the gate layer 109*a* in the area where the specified color is desired (e.g., in a bottom emission display where light from the light emitting layer 206*b* is emitted through the substrate layer 126). In the case of a top emission display (where light from the light emitting layer 206*b* is emitted through the drain layer(s) 119 of the DS-VOLET 103), the color filter layer may be placed on top of the drain layer(s) 119. In a third color attainment method, the light emitting layer 206*b* emits blue light and an appropriate color change layer is employed to attain R and G light on the R and G active cells, respectively. The position of the color change layer may be similar to that used for the color filter layer in the second color attainment method.

All of the previously mentioned embodiments assume the use of conventional patterning methods known to those skilled in the art. Conventional photolithography is a widely used method that is used for defining patterns for subsequent process steps such as subtractive etching (either wet or dry) of the material of interest which was deposited over the entire substrate prior to deposition of the photoresist. Photoresist is the polymer material used for making patterns by exposing desired regions with, typically, ultraviolet (UV) light. The exposed/unexposed regions of the positive/negative photoresist become soluble in developer solution after UV light exposure. The photoresist also covers the entire substrate and is typically deposited by spin coating. Methods other than subtractive etching may be utilized as well. Methods such as the lift-off process, which is typically used to define metals, may also be used for other material types. In the lift off method, the photoresist is applied prior to the deposition of the material of interest, which may be, for example, a metal. The photoresist, which is typically specifically designed for this purpose, typically referred to as a lift-off resist, then undergoes the conventional photolithography process steps of, UV light exposure and pattern development in developer solution. After the patterns are transferred to the lift-off resist, the metal may be deposited by a conventional method, such as sputtering. After deposition of the metal, the regions where the lift-off resist is still present, may be dissolved in a solvent, and the metal may be lifted off in those regions, leaving behind a patterned metal layer with the desired layout. Also, for methods that are self patterning, such as gravure printing, flexography, ink-jet printing and vapor jet printing, conventional photolithography may not be necessary.

All figures contained in this application are not to scale. The organic semiconducting layers are not necessarily restricted to being organic. In other embodiments, the organic semiconducting layers may be inorganic, in which case they would be merely semiconducting layers. Possible inorganic semiconductors include silicon (amorphous, single crystal, micro/nanocrystalline and polycrystalline) and nanoparticles.

It should be emphasized that the above-described embodiments are merely possible examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure and the present application.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A display panel comprising:
    an array comprising a plurality of pixels, wherein each pixel of the plurality of pixels comprises:
        a switching transistor; and
        a driving transistor having a drain layer and a source layer, wherein the driving transistor is coupled to the switching transistor and configured to emit light responsive to activation by the switching transistor and to have a frequency response that depends on a gate capacitance of the driving transistor and a resistance of the source layer of the driving transistor;
    at least one source conducting line coupled to the source layer; and
    an interlayer dielectric layer positioned between the drain layer and the at least one source conducting line, wherein:
    the pixel does not further comprise a storage capacitor separate from the switching transistor or the driving transistor.

2. The display panel of claim 1, wherein the driving transistor is a dilute source enabled vertical organic light emitting transistor (DS-VOLET) coupled to the switching transistor.

3. The display panel of claim 2, wherein the DS-VOLET is a carbon nanotube enabled vertical organic light emitting transistor (CN-VOLET).

4. The display panel of claim 2, wherein the DS-VOLET comprises:
    a substrate layer;
    a gate electrode positioned on the substrate for providing a gate field;
    a source layer comprising a dilute source material;
    a dielectric layer interposed between the gate electrode and the source layer, wherein said dielectric layer is positioned on the gate electrode;

a drain layer, wherein said drain layer includes a conductor for injecting a charge that is complementary to another charge injected by the source layer; and an active layer disposed between the source layer and the drain layer, wherein the charges combine to produce photons, and a charge injection between the source layer and the active layer is modulated by a gate field.

5. The display panel of claim 4, wherein the substrate layer is an insulator.

6. The display panel of claim 5, wherein the substrate layer includes at least one of glass and plastic.

7. The display panel of claim 4, wherein the substrate layer is metal and wherein an insulating base layer is positioned between the substrate layer and the switching transistor and between the substrate layer and the DS-VOLET.

8. The display panel of claim 7, wherein the insulating base layer includes at least one of silicon oxide, silicon nitride, polymide, and a solution processable insulating polymer.

9. The display panel of claim 4, wherein the substrate layer is flexible.

10. The display panel of claim 1, wherein the pixel has a side dimension on the order of 100 microns and a gate electrode of the driving transistor has a size sufficient to retain a majority of data charge between refresh cycles.

11. The display panel of claim 4, wherein the gate electrode includes at least one of tin-doped indium oxide (ITO), aluminum, molybdenum, tantalum, titanium and gold.

12. The display panel of claim 1, wherein for the plurality of the pixels, each pixel is bounded by conducting lines defining an area, and the area is substantially filled by the driving transistor and the switching transistor.

13. The display panel of claim 4, wherein the gate dielectric layer is a bi-layer.

14. The display panel of claim 13, wherein the bi-layer includes an inorganic oxide layer and a hydrophobizing polymer layer.

15. The display panel of claim 14, wherein the inorganic oxide layer comprises aluminum oxide and the hydrophobizing polymer layer comprises benzocyclobutene (BCB).

16. The display panel of claim 4, wherein the dilute source material includes a percolating dilute network.

17. The display panel of claim 4, wherein the dilute source material includes a low density of states material.

18. The display panel of claim 4, wherein the dilute source material includes graphene.

19. The display panel of claim 4, wherein the dilute source material includes multiple layers of graphene.

20. The display panel of claim 19, where in the graphene is patterned to have perforations.

21. The display panel of claim 4, wherein the dilute source material includes a dilute network of carbon nanotubes.

22. The display panel of claim 4, wherein the active layer includes a semiconductor layer and a light emitting layer.

23. The display panel of claim 22, wherein the semiconductor layer includes an organic semiconductor or an inorganic semiconductor.

24. The display panel of claim 22, wherein the active layer includes a plurality of semiconductor layers.

25. The display panel of claim 24, wherein the plurality of semiconductor layers includes a poly-crystalline semiconductor layer and a solution processable polymer layer positioned on the poly-crystalline semiconductor layer.

26. The display panel of claim 25, wherein the solution processable polymer layer is a cross-linkable solution processable polymer layer.

27. The display panel of claim 22, wherein the active layer includes a plurality of light emitting layers.

28. The display panel of claim 22, wherein the active layer further includes a transitional conducting layer between the semiconductor layer and the light emitting layer.

29. The display panel of claim 28, further comprising a second interlayer dielectric layer that electrically insulates the transitional conducting layer from the source conducting line.

30. The display panel of claim 28, wherein a portion of the transitional conducting layer directly contacts a substrate layer.

31. The display panel of claim 4, wherein the source layer is coupled to a source conducting line.

32. The display panel of claim 4, wherein the drain layer is bi-layer.

33. The display panel of claim 32, wherein the bi-layer includes a lithium fluoride layer and an aluminum layer.

34. The display panel of claim 4, wherein the drain layer is multi-layer.

35. The display panel of claim 34, wherein the multi-layer includes a lithium fluoride layer, a molybdenum oxide layer, and a tin-doped indium oxide (ITO) layer.

36. The display panel of claim 2, wherein the switching transistor is coupled to the DS-VOLET by a conducting line.

37. The display panel of claim 36, wherein the conducting line forms a drain electrode of the switching transistor.

38. The display panel of claim 1, wherein the switching transistor includes a thin film transistor (TFT).

39. The display panel of claim 1, wherein the switching transistor is coupled to a data conducting line, the data conducting line forming a source electrode of the switching transistor.

40. The display panel of claim 1, wherein the switching transistor includes a gate electrode coupled to a scan conducting line.

41. The display panel of claim 1, wherein the switching transistor includes a dilute source enabled vertical-field effect transistor (DS-VFET).

42. The display panel of claim 41, wherein a source layer of the DS-VFET includes a percolating dilute network.

43. The display panel of claim 41, wherein a source layer of the DSVFET includes a low density of states material.

44. The display panel of claim 41, wherein a source layer of the DS-VFET includes a layer of graphene.

45. The display panel of claim 44, wherein the graphene is patterned to have perforations.

46. The display panel of claim 41, wherein the DS-VFET is a carbon nanotube enabled vertical-field effect transistor (CN-VFET).

47. The display panel of claim 46, wherein a source layer of the CN-VFET includes a dilute network of carbon nanotubes.

48. The display panel of claim 41, wherein the DS-VFET includes a source layer coupled to a data conducting line and a drain layer conducting line coupled to a gate electrode of the driving transistor.

49. The display panel of claim 41, wherein the DS-VFET includes a drain layer coupled to a data conducting line and a drain layer conducting line coupled to a gate electrode of the driving transistor.

50. The display panel of claim 41, wherein the DS-VFET includes:
   a gate electrode positioned on the substrate;
   a gate dielectric layer positioned on the gate electrode;
   a source layer comprising a dilute source material positioned on the gate dielectric layer;
   a semiconductor layer; and
   a drain layer, wherein the semiconductor layer is positioned between the source layer and the drain layer.

51. The display panel of claim 50, wherein the gate dielectric layer is a bi-layer.

52. The display panel of claim 51, wherein the bi-layer includes an inorganic oxide layer and a hydrophobizing polymer layer.

53. The display panel of claim 52, wherein the inorganic oxide layer comprises aluminum oxide and the hydrophobizing polymer layer comprises benzocyclobutene (BCB).

54. The display panel of claim 1, wherein the each pixel of the plurality does not further comprise another transistor.

55. A display panel comprising:
an array of pixels, wherein at least one pixel comprises:
a switching transistor; and
a driving transistor coupled to the switching transistor, wherein the driving transistor is configured to emit light responsive to activation by the switching transistor, wherein the driving transistor comprises:
a gate electrode;
a source layer comprising a dilute source material;
a dielectric bi-layer comprising a first layer comprising an inorganic oxide and a second layer comprising a polymer, wherein the dielectric bi-layer is interposed between the gate electrode and the source layer, and the driving transistor has a frequency response that depends on a resistance of the source layer and a gate capacitance provided by the dielectric bi-layer, wherein the gate capacitance is less than 3.7 nF;
a semiconductor layer; and
a light-emitting layer.

56. The display panel of claim 55, wherein the first layer of the dielectric bi-layer comprises aluminum oxide.

57. The display panel of claim 55, wherein the second layer of the dielectric bi-layer comprises benzocyclobutene (BCB).

58. The display panel of claim 55, wherein the dilute source material comprises a dilute network of carbon nanotubes.

59. A display panel comprising:
an array of pixels, wherein pixels in the array each have a side dimension of between 100 and 400 microns and comprise:
a switching transistor; and
a driving transistor coupled to the switching transistor, wherein the driving transistor is configured to emit light responsive to activation by the switching transistor, wherein the driving transistor comprises:
a gate electrode;
a source layer comprising a dilute source material, wherein the driving transistor is configured to have a frequency response that depends on a resistance of a source layer and a gate capacitance between the source layer and the gate electrode such that the switching speed of the pixel is greater than 200 kHz;
a semiconductor layer;
a drain layer;
a light-emitting layer positioned between the semi-conducting layer and the drain layer, wherein the drain layer is configured to allow transmission of light generated by the light-emitting layer; and
a non-transparent layer positioned between the light-emitting layer and the semiconductor layer.

60. The display panel of claim 59, wherein the non-transparent layer is capable of absorbing and/or reflecting light having a wavelength in the range of light emitted by the light-emitting layer.

61. The display panel of claim 59, wherein the non-transparent layer comprises a metal.

62. The display panel of claim 59, wherein the dilute source material comprises a dilute network of carbon nanotubes.

63. A display panel comprising:
an array of pixels, wherein a plurality of the pixels each comprises:
a switching transistor; and
a dilute source enabled vertical organic light emitting transistor (DS-VOLET) coupled to the switching transistor, wherein the DS-VOLET is configured to emit light responsive to activation by the switching transistor and comprises:
a substrate layer;
a gate electrode positioned on the substrate for providing a gate field;
a source layer comprising a dilute source material;
a dielectric layer interposed between the gate electrode and the source layer, wherein said dielectric layer is positioned on the gate electrode;
a drain layer, wherein said drain layer includes a conductor for injecting a charge that is complementary to another charge injected by the source layer; and
an active layer disposed between the source layer and the drain layer, wherein the charges combine to produce photons, a charge injection between the source layer and the active layer is modulated by a gate field, and the active layer includes a semiconductor layer, a light emitting layer, and a transitional conducting layer between the semiconductor layer and the light emitting layer, and
an interlayer dielectric layer that electrically insulates the transitional conducting layer from a source conducting line.

64. The display panel of claim 63, wherein the plurality of semiconductor layers includes a poly-crystalline semiconductor layer and a solution processable polymer layer positioned on the poly-crystalline semiconductor layer.

65. The display panel of claim 64, wherein the solution processable polymer layer is a cross-linkable solution processable polymer layer.

66. The display panel of claim 63, wherein the semiconductor layer includes an organic semiconductor or an inorganic semiconductor and a portion of the transitional conducting layer directly contacts a substrate layer.

67. A display panel comprising:
an array of pixels, wherein a plurality of the pixels each comprises:
a switching transistor; and
a dilute source enabled vertical organic light emitting transistor (DS-VOLET) coupled to the switching transistor, wherein the DS-VOLET is configured to emit light responsive to activation by the switching transistor and comprises:
a substrate layer;
a gate electrode layer positioned on the substrate for providing a gate field;
a source layer comprising a dilute source material;
a dielectric layer interposed between the gate electrode and the source layer, wherein said dielectric layer is positioned on the gate electrode;
a drain layer, wherein said drain layer includes a conductor for injecting a charge that is complementary to another charge injected by the source layer;
an active layer disposed between the source layer and the drain layer, and
a planarization layer on the active layer.

68. The display panel of claim 67, wherein the planarization layer is a cross-linkable solution processable polymer layer.

69. The display panel of claim 67, wherein the planarization layer is an organic semiconducting layer.

70. The display panel of claim 67, wherein:
- the active layer includes a light emitting layer and a poly-crystalline semiconductor layer; and
- the planarization layer is positioned on the poly-crystalline semiconductor layer.

* * * * *